US012713666B2

(12) United States Patent
Wu et al.

(10) Patent No.: US 12,713,666 B2
(45) Date of Patent: Aug. 18, 2026

(54) METHODS FOR ELECTRICAL ISOLATION OF TRANSISTORS

(71) Applicant: Taiwan Semiconductor Manufacturing Company LTD, Hsinchu (TW)

(72) Inventors: Yun-Chen Wu, Hsinchu (TW); Tzu-Ging Lin, Kaohsiung (TW); Jih-Jse Lin, Sijhih (TW); Jun-Ye Liu, Hsinchu (TW); Chun-Liang Lai, Hsinchu (TW); Chih-Yu Hsu, Xinfeng (TW)

(73) Assignee: TAIWAN SEMICONDUCTOR MANUFACTURING COMPANY, LTD, Hisinchu (TW)

( * ) Notice: Subject to any disclaimer, the term of this patent is extended or adjusted under 35 U.S.C. 154(b) by 319 days.

(21) Appl. No.: 18/372,301

(22) Filed: Sep. 25, 2023

(65) Prior Publication Data

US 2025/0107170 A1 Mar. 27, 2025

(51) Int. Cl.
*H10D 62/10* (2025.01)
*H10D 30/01* (2025.01)
(Continued)

(52) U.S. Cl.
CPC ......... *H10D 62/115* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0128* (2025.01);
(Continued)

(58) Field of Classification Search
CPC ............... H10D 62/115; H10D 30/014; H10D 84/0151; H10D 30/6757; H10D 62/121; H10D 64/017; H10D 30/6735; H10D 30/43; H10D 84/0128; H10D 84/038; H10W 10/014; H10W 10/17
See application file for complete search history.

(56) References Cited

U.S. PATENT DOCUMENTS 10,998,311 B2 * 5/2021 Leobandung ........ H10D 84/834
2014/0349458 A1 11/2014 Wu et al.
(Continued)

OTHER PUBLICATIONS

Taiwan Office Action Application No. 11321006660 Dated: Oct. 7, 2024.

*Primary Examiner* — Richard A Booth
(74) *Attorney, Agent, or Firm* — Lippes Mathias LLP

(57) ABSTRACT

Methods for isolating two adjacent transistors are disclosed. A substrate has a first semiconducting fin on a first region and a second semiconducting fin on a second region, and the first semiconducting fin and the second semiconducting fin contact each other at a jog region. A dummy gate within or adjacent the jog region is removed to expose a portion of the first semiconducting fin and form an isolation volume. Etching is performed to remove the exposed portion of the first semiconducting fin and create a trench in the substrate. The trench and the isolation volume are filled with at least one dielectric material to form an electrically isolating structure between the first region and the second region. Additional dummy gates in each region can be removed and replaced with an electrically conductive material to form two adjacent transistors electrically isolated from each other.

20 Claims, 29 Drawing Sheets

(51) Int. Cl.

| | |
|---|---|
| ***H10D 30/43*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |
| ***H10W 10/00*** | (2026.01) |
| ***H10W 10/17*** | (2026.01) |

(52) U.S. Cl.
CPC ....... *H10D 84/0151* (2025.01); *H10D 84/038* (2025.01); *H10D 84/83* (2025.01); *H10W 10/014* (2026.01); *H10W 10/17* (2026.01)

(56) References Cited

U.S. PATENT DOCUMENTS

| | | | | |
|---|---|---|---|---|
| 2016/0013273 | A1* | 1/2016 | Zhang .................. | H10D 30/024 438/478 |
| 2021/0280474 | A1* | 9/2021 | Wang ................. | H10D 84/0149 |
| 2022/0246433 | A1 | 8/2022 | Lin et al. | |

* cited by examiner

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

X Cut 1

X Cut 2

Y Cut 1

Y Cut 2

METHODS FOR ELECTRICAL ISOLATION OF TRANSISTORS

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a plan view. FIG. 2B is a first X-axis view of the substrate along line X1-X1 of FIG. 2A. FIG. 2C is a second X-axis view of the substrate along line X2-X2 of FIG. 2A. FIG. 2D is a first Y-axis view of the substrate along line Y1-Y1 of FIG. 2A. FIG. 2E is a second Y-axis view of the substrate along line Y2-Y2 of FIG. 2A.

FIG. 3A is a first X-axis view of the substrate along line X1-X1 of FIG. 2A. FIG. 3B is a second X-axis view of the substrate along line X2-X2 of FIG. 2A. FIG. 3C is a first Y-axis view of the substrate along line Y1-Y1 of FIG. 2A. FIG. 3D is a second Y-axis view of the substrate along line Y2-Y2 of FIG. 2A.

FIG. 4A is a first X-axis view of the substrate along line X1-X1 of FIG. 2A. FIG. 4B is a second X-axis view of the substrate along line X2-X2 of FIG. 2A. FIG. 4C is a first Y-axis view of the substrate along line Y1-Y1 of FIG. 2A. FIG. 4D is a second Y-axis view of the substrate along line Y2-Y2 of FIG. 2A.

FIG. 5A is a first X-axis view of the substrate along line X1-X1 of FIG. 2A. FIG. 5B is a second X-axis view of the substrate along line X2-X2 of FIG. 2A. FIG. 5C is a first Y-axis view of the substrate along line Y1-Y1 of FIG. 2A. FIG. 5D is a second Y-axis view of the substrate along line Y2-Y2 of FIG. 2A.

FIG. 6A is a first X-axis view of the substrate along line X1-X1 of FIG. 2A. FIG. 6B is a second X-axis view of the substrate along line X2-X2 of FIG. 2A. FIG. 6C is a first Y-axis view of the substrate along line Y1-Y1 of FIG. 2A. FIG. 6D is a second Y-axis view of the substrate along line Y2-Y2 of FIG. 2A.

FIG. 7A is a first X-axis view of the substrate along line X1-X1 of FIG. 2A. FIG. 7B is a second X-axis view of the substrate along line X2-X2 of FIG. 2A. FIG. 7C is a first Y-axis view of the substrate along line Y1-Y1 of FIG. 2A. FIG. 7D is a second Y-axis view of the substrate along line Y2-Y2 of FIG. 2A.

FIG. 8A is a first X-axis view of the substrate along line X1-X1 of FIG. 2A. FIG. 8B is a second X-axis view of the substrate along line X2-X2 of FIG. 2A. FIG. 8C is a first Y-axis view of the substrate along line Y1-Y1 of FIG. 2A. FIG. 8D is a second Y-axis view of the substrate along line Y2-Y2 of FIG. 2A.

FIG. 9A is a plan view, with lines X1-X1, X2-X2, Y1-Y1, and Y2-Y2 drawn again as in FIG. 2A. FIG. 9B is a first X-axis view of the substrate along line X1-X1. FIG. 9C is a second X-axis view of the substrate along line X2-X2. FIG. 9D is a first Y-axis view of the substrate along line Y1-Y1. FIG. 9E is a second Y-axis view of the substrate along line Y2-Y2.

FIG. 10A is a first X-axis view of the substrate along line X1-X1 of FIG. 9A. FIG. 10B is a second X-axis view of the substrate along line X2-X2 of FIG. 9A. FIG. 10C is a first Y-axis view of the substrate along line Y1-Y1 of FIG. 9A. FIG. 10D is a second Y-axis view of the substrate along line Y2-Y2 of FIG. 9A.

FIG. 11A is a first X-axis view of the substrate along line X1-X1 of FIG. 9A. FIG. 11B is a second X-axis view of the substrate along line X2-X2 of FIG. 9A. FIG. 11C is a first Y-axis view of the substrate along line Y1-Y1 of FIG. 9A. FIG. 11D is a second Y-axis view of the substrate along line Y2-Y2 of FIG. 9A.

In FIG. 12A, two fins having different widths are joined together in the jog region. In FIG. 12B, one side of a fin is joined to multiple fins in the jog region. In FIG. 12C, two fins having the same width are offset from each other at the jog region.

DETAILED DESCRIPTION

Figure 1:
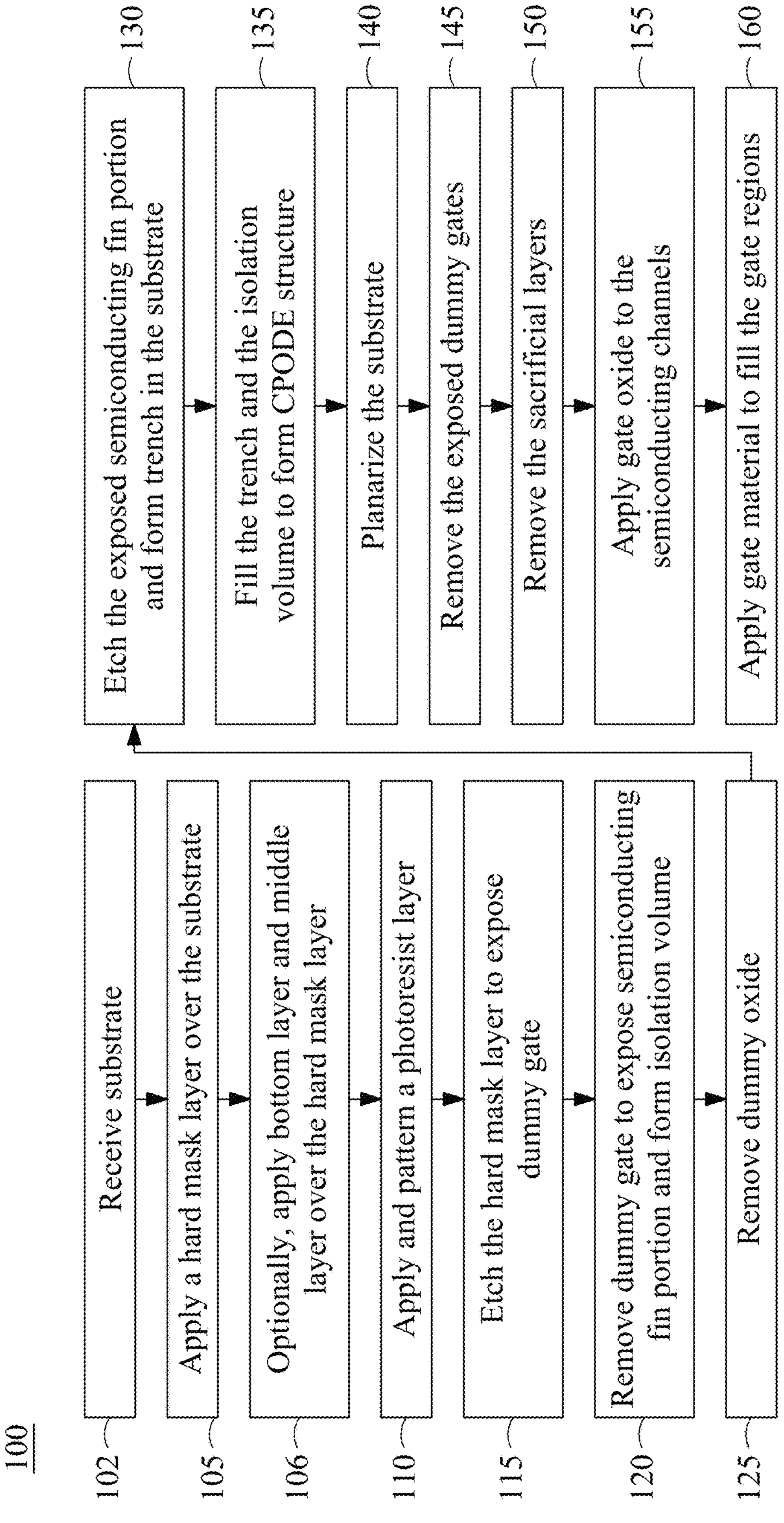
FIG. 1 is a flow chart illustrating a method for preparing a patterned photoresist layer and etching a layer of a semiconducting device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example, all layers of the structure can be considered to be "on" the substrate, even though they do not all directly contact the substrate. The term "directly" may be used to indicate two layers directly contact each other without any layers in between them. In addition, when referring to performing process steps to the substrate, this should be construed as performing such steps to whatever layers may be present on the substrate as well, depending on the context.

The terms "high current" and "low current", as used in the present disclosure, are relative terms that compare the values of two currents to each other, with the higher current being considered "high current" and the lower current being considered "low current". It is possible for a current of value X to be both a high current or a low current, depending on the value of the current to which it is being compared.

The present disclosure relates to methods and systems for reducing damage to adjacent transistors, especially with respect to Gate-All-Around (GAA) transistors. Transistors may be designed to handle particular current density ranges for a given application. GAA transistors may use nanosheets as the semiconducting channel, and the number of nanosheets and their width can also be varied to obtain desired performance characteristics.

Jog designs, where structures in a given layer have a non-linear shape, can substantially raise the efficiency of area usage. In generating nanosheets, integrating high/large current (wide nanosheets) and small/low current (narrow or thin nanosheets) applications can be risky if a high current passes through a narrow nanosheet. It may also be costly to use separate photomasks and process steps to define high-current regions and low-current regions on a substrate. Finally, transistor isolation processes that occur in middle-end-of-line (MEOL) processes (after metal gate deposition and the transistor is completely formed) risk damaging epitaxial silicon structures in the transistor.

In the present disclosure, a continuous poly on diffusion edge (CPODE) structure or pattern is used as an electrically insulating or dielectric feature on the wafer substrate within or adjacent the jog region. The CPODE structure is formed by etching away one or more semiconducting fins and forming a trench in the substrate where each fin was originally located, and then filling the trench with a dielectric material. This provides electrical isolation between neighboring active device regions, such as transistors. The methods of the present disclosure can be useful when there is a jog in the semiconducting fin and/or when semiconducting fins of different widths are joined together.

FIG. 1 is a flow chart illustrating a method 100 for isolating a first region from a second region on a substrate, in accordance with some embodiments. The method is useful for electrically isolating two adjacent transistors from each other. FIGS. 2A-11D illustrate various steps of the method, and these figures are discussed together. These figures provide different views for better understanding.

It is noted that certain conventional steps are not completely described each time in the discussion below, and may be merely referred to with respect to their result. For example, a pattern/structure may be formed in a given layer by applying a photoresist layer, patterning the photoresist layer, developing the photoresist layer, and then etching, but the discussion below may refer only to patterning the given layer. For completeness, some of these various steps are described now.

Generally, a photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate. The speed of the rotating platen is then increased to spread the resist evenly from the center of the substrate to the perimeter of the substrate. The rotating speed of the platen is then fixed, which can control the thickness of the final photoresist layer.

Next, the photoresist composition is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

The photoresist layer is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. This results in some portions of the photoresist layer being exposed to radiation, and some portions of the photoresist not being exposed to radiation. This exposure causes some portions of the photoresist to become soluble in the developer and other portions of the photoresist to remain insoluble in the developer.

An additional photoresist bake step (post exposure bake, or PEB) may occur after the exposure to radiation. For example, this may help in releasing acid leaving groups (ALGs) or other molecules that are significant in chemical amplification photoresist.

The photoresist layer is then developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Other developers may include 2-heptanone, n-butyl acetate, isoamyl acetate, cyclohexanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, or isobutyl propionate. Generally, any suitable developer may be used. Sometimes, a post develop bake or "hard bake" may be performed to stabilize the photoresist pattern after development, for optimum performance in subsequent steps.

Continuing, portions of the layer below the patterned photoresist layer are now exposed. Etching transfers the photoresist pattern to the layer below the patterned photoresist layer. After use, the patterned photoresist layer can be removed, for example, using various solvents such as N-methyl-pyrrolidone (NMP) or alkaline media or other strippers at elevated temperatures, or by dry etching using oxygen plasma.

Generally, any etching step used herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), difluoromethane ($CH_2F_2$), fluoromethane ($CH_3F$), fluoroform or trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), or the like, or combinations thereof in various ratios. For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$.

Planarizing may be performed to obtain a flat surface. The planarizing may be performed, for example, using a chemical mechanical polishing (CMP) process. Generally, CMP is performed using a rotating platen to which a polishing pad is attached. The substrate is attached to a rotating carrier. A slurry or solution containing various chemicals and abrasives is dispensed onto the polishing pad or the wafer substrate. During polishing, both the polishing pad and the carrier rotate, and this induces mechanical and chemical effects on the surface of the wafer substrate and/or the top layer thereon, removing undesired materials and creating a highly level surface. A post-CMP cleaning step is then carried out using rotating scrubber brushes along with a washing fluid to clean one or both sides of the wafer substrate.

Finally, cleaning steps such as wet cleaning may be performed between various processing steps. The cleaning solution will depend on the etch recipe and the exposed layers. Examples of cleaning solutions may include deionized water, dilute HF, and other conventional solutions.

The methods and systems of the present disclosure include several different dielectric structures. Such dielectric structures can be made from any suitable combination of dielectric materials. Examples of dielectric materials may include silicon dioxide ($SiO_2$), silicon nitride ($Si_3N_4$), silicon carbide (SiC), hafnium dioxide ($HfO_2$), zirconium dioxide ($ZrO_2$), aluminum oxide ($Al_2O_3$), silicon oxynitride ($SiO_xN_y$), hafnium oxynitride ($HfO_xN_y$) or zirconium oxynitride ($ZrO_xN_y$), or hafnium silicates ($ZrSi_xO_y$) or zirconium silicates ($ZrSi_xO_y$) or silicon carboxynitride ($SiC_xO_yN_z$), or hexagonal boron nitride (hBN). Other dielectric materials may include tantalum oxide ($Ta_2O_5$), nitrides such as silicon nitride, polysilicon, phosphosilicate glass (PSG), fluorosilicate glass (FSG), undoped silicate glass (USG), high-stress undoped silicate glass (HSUSG), and borosilicate glass (BSG).

Continuing, then, FIGS. 2A-2E show a beginning state of a partially completed integrated circuit 200 on the wafer substrate 202 as received in step 102 of FIG. 1, before the method steps are performed. Referring first to the plan view of FIG. 2A, a set of dummy gates 212 is shown. Located between each pair of dummy gates 212 are a pair of low-k dielectric spacers 224 and a continuous etch stop layer (CESL) 226.

The dotted lines indicate the location of semiconducting fins below the dummy gates 212, the dielectric spacers 224, and the CESL 226. As illustrated in this example, there are a first fin portion 262 and a second fin portion 264 in a first region 282 of the substrate. There is a third fin portion 266 in a second or middle region 284 of the substrate. Finally, there are a fourth fin portion 268 and a fifth fin portion 270 in a third region 286 of the substrate.

As illustrated here, the first region 282 is adjacent the second region 284. Similarly, the second region 284 is adjacent the third region 286, and separates the first region from the third region. However, it is noted that these terms are merely identifying labels for these regions. Thus, any one of the three regions 282, 284, 286 could be designated a first region, a second region, etc.

The first fin portion 262 has a width 263. The second fin portion 264 has a width 265. The third fin portion 266 has a width 267. The fourth fin portion 268 has a width 269. The fifth fin portion 270 has a width 271. The width of each fin portion is independent from that of the other fin portions. As illustrated here, the width 267 of the third fin portion is greater than the width 263, 265, 269, 271 of the other fin portions.

Prior to forming the CPODE structure, the five fin portions are joined together, and can be considered as forming a single semiconducting fin 260. As another alternative, each fin portion can be considered a semiconducting fin by itself. As a second alternative, the fin portions in each region can be considered together as a semiconducting fin for that region, because the current density in the region is proportional to the sum of the widths of the fin portions in the region. The locations where the fin portions join each other can be referred to as a jog region 280, and two such jog regions are indicated here with a rectangular shape. It is noted that for purposes of simplicity, the jog region is shown as having a 90° intersection between the fin portions, but their joinder angle can be lower.

Figure 2A:
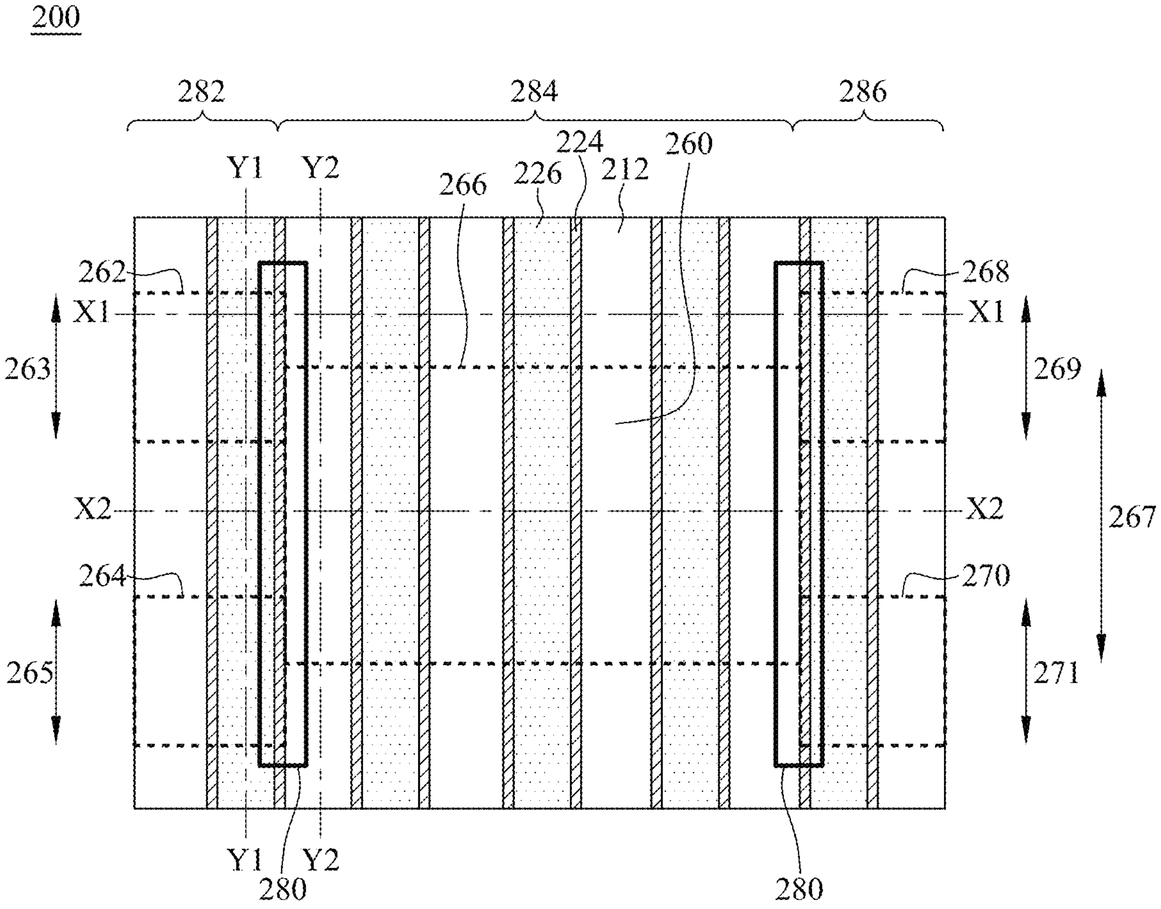
FIGS. 2A-2E are different views of a partially-completed substrate prior to starting the method of FIG. 1.
Figure 2B:
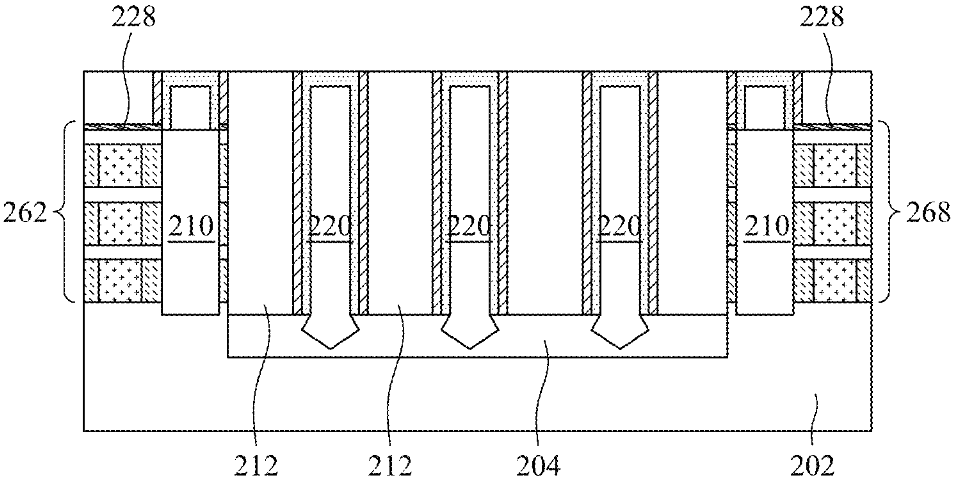

Referring now to FIG. 2B, a cross-sectional view is provided. The integrated circuit is built upon a substrate 202. The substrate is usually a wafer made of a semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon.

Continuing, a shallow trench isolation (STI) region or layer 204 is present upon the substrate 202 around the fin portions. The dielectric material in the STI layer is commonly silicon dioxide, although other dielectric materials can also be used such as undoped polysilicon, silicon oxide (e.g. $SiO_2$), silicon nitride, silicon oxynitride, fluoride-doped silicate glass, or other low-k dielectric material. The deposition can be done using physical vapor deposition (PVD) or chemical vapor deposition (CVD) or spin-on processes known in the art, or can be grown via oxidation. The STI layer is usually deposited prior to building the various layers of the semiconducting fin 260/fin portions 262, 264, 266, 268, 270. If desired, the dielectric material can be deposited to a level above that of the substrate, then recessed back down to the desired height.

Figure 2C:
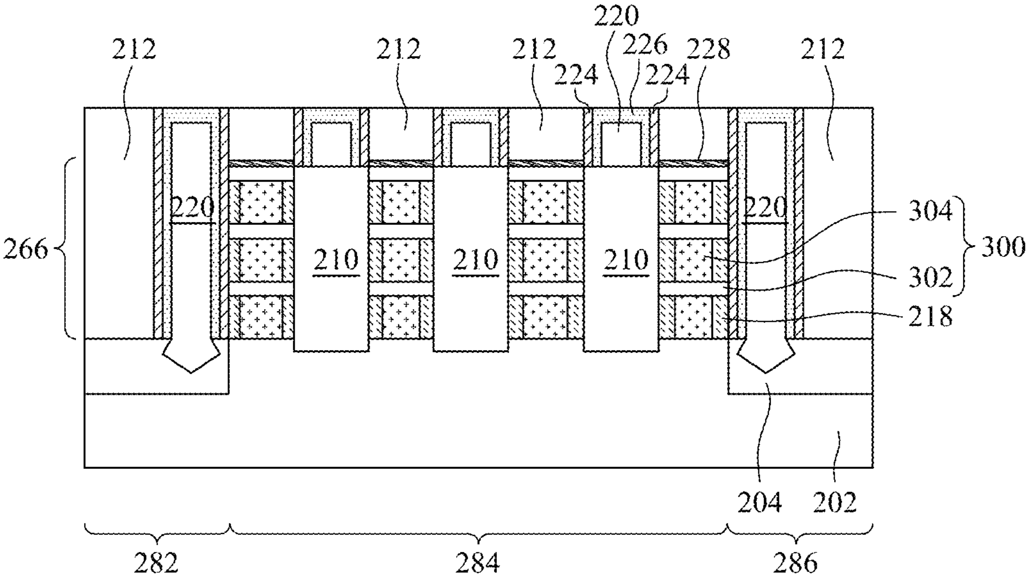
Figure 2D:
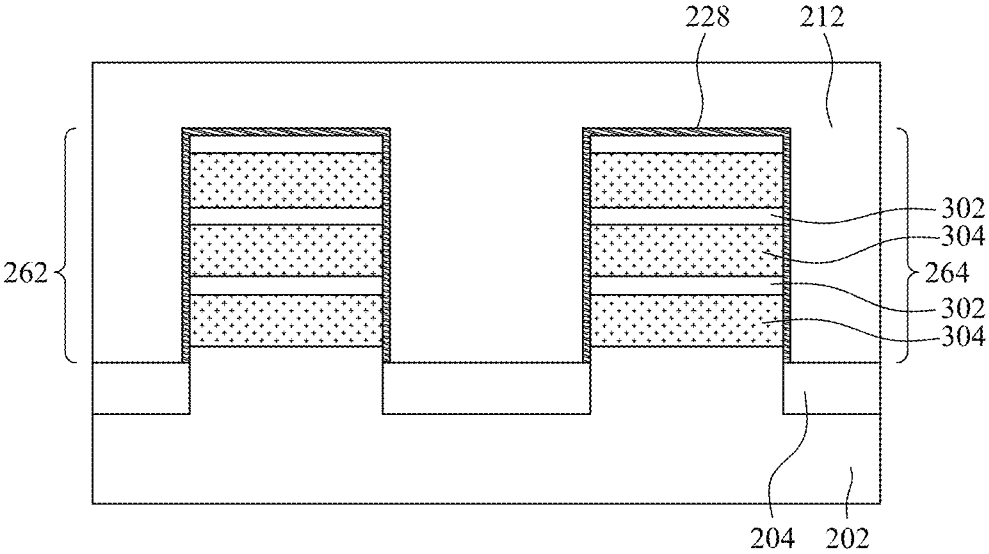
Figure 2E:
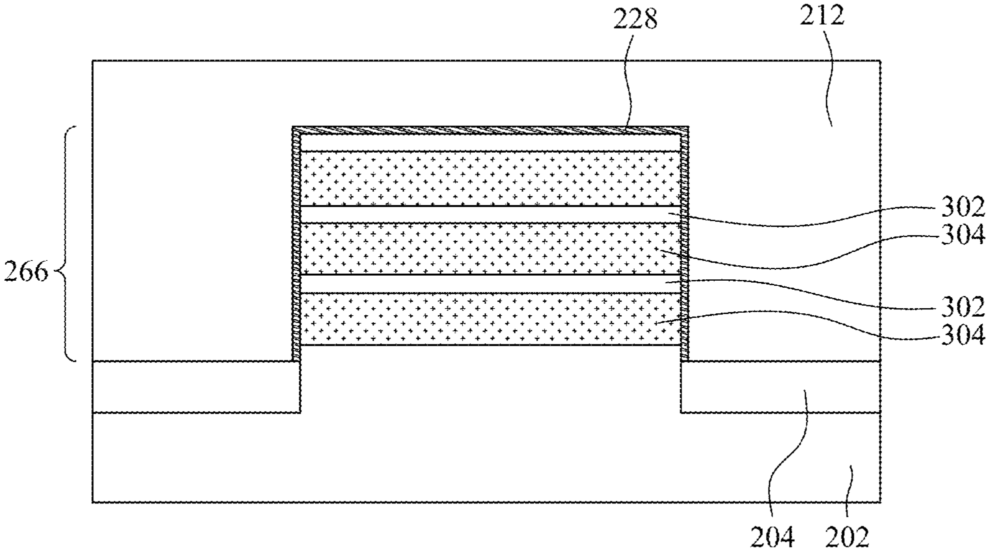

In FIG. 2B, the first fin portion 262 and the fourth fin portion 268 are visible in the X-axis view along line X1-X1. In FIG. 2C, the third fin portion 266 is visible in the X-axis view along line X2-X2. In FIG. 2D, the first fin portion 262 and the second fin portion 264 are visible in the Y-axis view along line Y1-Y1. In FIG. 2E, the third fin portion 266 is visible in the Y-axis view along line Y2-Y2.

As most easily seen in FIG. 2C, each fin portion contains a stack 300 formed by alternating layers of a semiconducting nanosheet 302 and a sacrificial layer 304. These layers can be made using CVD, atomic layer deposition (ALD), molecular beam epitaxy (MBE), liquid phase epitaxy (LPE), vapor phase epitaxy (VPE), or any other appropriate process. Each semiconducting nanosheet layer may be, for example, silicon or other materials suitable for the substrate. The sacrificial layers 304 can be made of any suitable material which can be selectively etched in comparison to the other materials that will be used in the transistor, such as for example SiGe.

Also present are source/drain regions 210 located within the fin portions. In particular embodiments, these regions are formed from epitaxial silicon using CVD, MOCVD, MBE, LPE, VPE, UHVCVD, or the like. They may also be doped with appropriate dopants such as boron, gallium, or indium; or phosphorus or arsenic. Inner dielectric spacers 218 separate the source/drain regions from the sacrificial layers 304 (which will eventually be removed and filled with electrically conductive gate material).

Continuing, interlayer dielectric (ILD) regions 220 and dummy gate regions 212 and CESL 226 are placed in alternating fashion over the substrate. As can be seen in FIG. 2B and FIG. 2C, the ILD regions 220 are aligned with and placed over the source/drain regions 210.

The ILD regions electrically separate the source/drain regions from the final gate terminals or electrodes. The ILD regions may be formed from any dielectric material, and do not need to be a high-k dielectric material. Suitable dielectrics could include silicon nitride, a silicon oxide (e.g. $SiO_2$), phosphosilicate glass (PSG), fluorosilicate glass (FSG), undoped silicate glass (USG), high-stress undoped silicate glass (HSUSG), borosilicate glass (BSG), or any combination thereof. The ILD can be deposited using any appropriate method, for example CVD. The ILD regions 220 are surrounded on three sides (top and sides) by the CESL 226. The CESL is commonly made from silicon nitride.

Located between the ILD regions are dummy gate regions 212. The dummy gate region is typically formed from polysilicon, and is used to define the shape of the final gate terminal or electrode. The vertical surfaces of the dummy gate regions 212 are covered with a low-k dielectric spacer 224 having a dielectric constant equal to or less than that of silicon nitride (~7). Suitable materials may include various nitrides or oxides. The CPODE structures are typically formed where a dummy gate region is located.

A dummy oxide layer 228 is located between the fin portions and the dummy gate regions 212. In FIG. 2B and FIG. 2C, this can be seen upon fin portions 262, 266, 268. As can be seen in FIG. 2D and FIG. 2E, the dummy oxide layer is present on both the top and the sides of each semiconducting fin portion 262, 264, 266.

The partially completed integrated circuit 200 on the wafer substrate 202 may be prepared by first etching the substrate to define trenches for the STI layer 204. The trenches are then filled with a dielectric material to form the STI layer. Next, the fin stack 300 is formed by depositing the alternating layers of semiconducting nanosheets 302 and sacrificial layers 304 upon the substrate. A hard mask is applied and the fin stack is etched to obtain the semiconducting fin with fin portions in their desired location. An anisotropic etch of the sacrificial layers is performed, and inner dielectric spacers 218 are formed in these etched locations on the exposed exterior walls of the fin stack. The fin stack is then etched to create trenches in desired locations for the source/drain regions 210. Another anisotropic etch is performed on the newly exposed surfaces of the sacrificial layers within these trenches, and inner dielectric spacers 218 are again formed in the newly-etched locations. A dummy oxide layer 228 is then formed on exposed silicon surfaces. Epitaxial silicon is then deposited into the trenches to form the source/drain regions 210. A dummy gate material, such as polysilicon is then deposited over the substrate. Another photomask is applied and the dummy gate material is etched to create trenches over the source/drain regions and to form dummy gate regions 212. A low-k dielectric spacer 224 is then applied to the exposed vertical surfaces of the dummy gate regions. The ILD regions 220 are then formed over the source/drain regions. The CESL 226 is then applied over the three exposed sides of the ILD regions.

Referring now to step 105 of FIG. 1 as illustrated in FIGS. 3A-3D, a hard mask layer 310 having thickness 315 is applied upon the dummy gate regions 212 and the ILD regions 220. In some embodiments, the thickness 315 of the hard mask layer is from about 600 angstroms to about 900 angstroms, or from about 700 angstroms to about 800 angstroms.

In optional step 106 of FIG. 1, a bottom layer 320 and/or a middle layer 322 can be applied over the hard mask layer 310. A spin-on-carbon (SoC) material is suitable for the bottom layer. A spin-on-glass material is commonly used for the middle layer. When used, the combination of the hard mask layer, the bottom layer, and the middle layer results in a tri-layer patterning etch system, which allows for better control of subsequent etching. Then, in step 110 of FIG. 1, a photoresist (PR) layer 324 is applied and patterned. In particular embodiments, extreme ultraviolet (EUV) light having a wavelength of about 13.5 nm is used for patterning, as this permits smaller feature sizes to be obtained. If the bottom layer and middle layer are not used, then the PR layer would be applied directly to the hard mask layer 310.

Figure 3A:
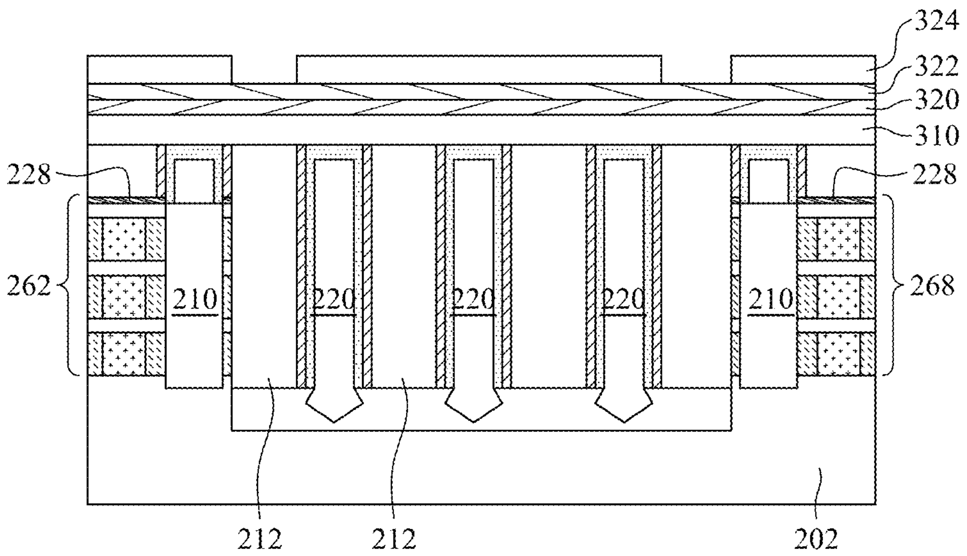
FIGS. 3A-3D are different views of the substrate after a hard mask layer and patterning layers are applied.
Figure 3B:
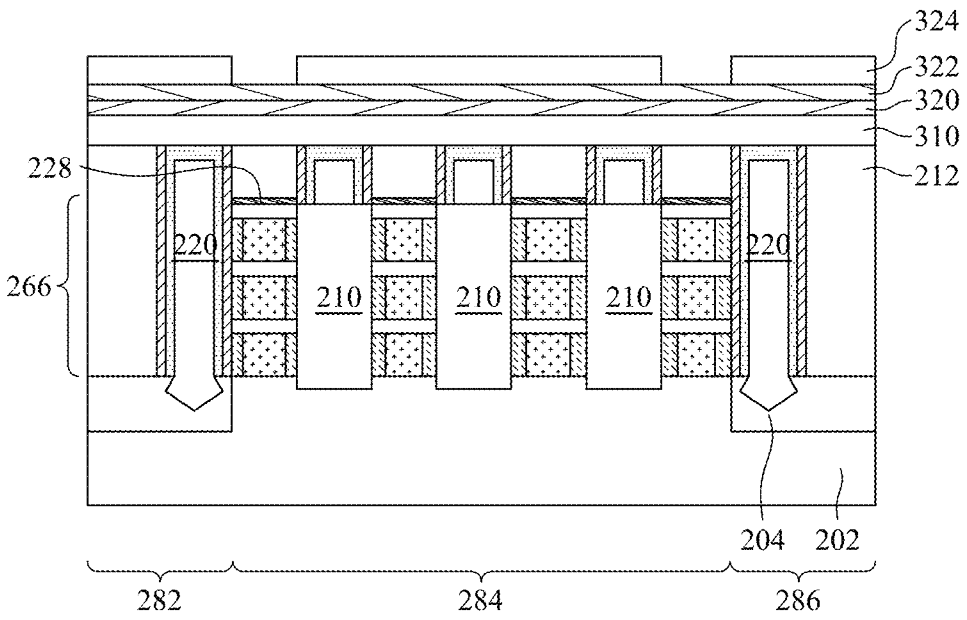
Figure 3C:
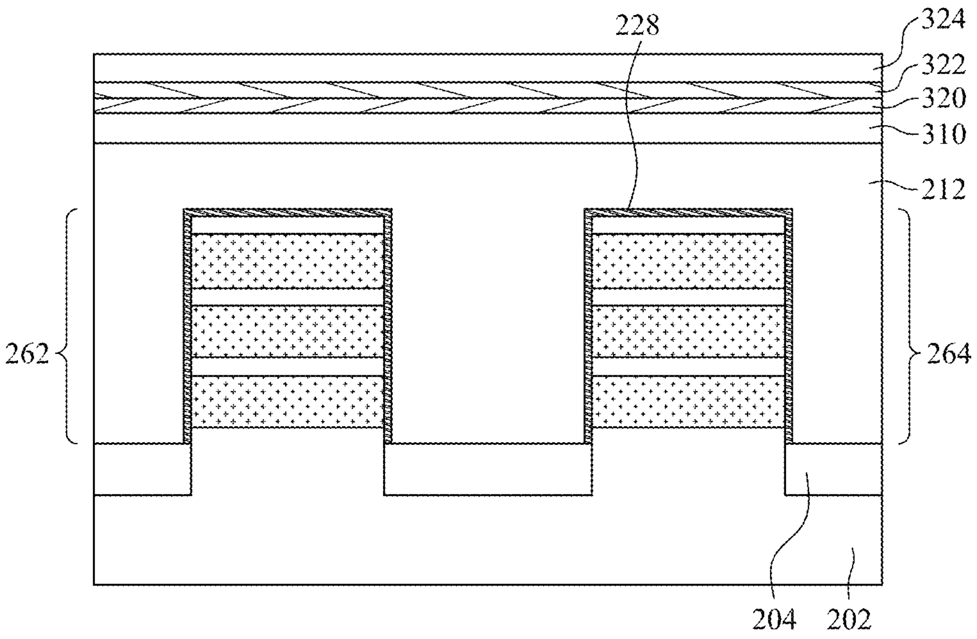
Figure 3D:
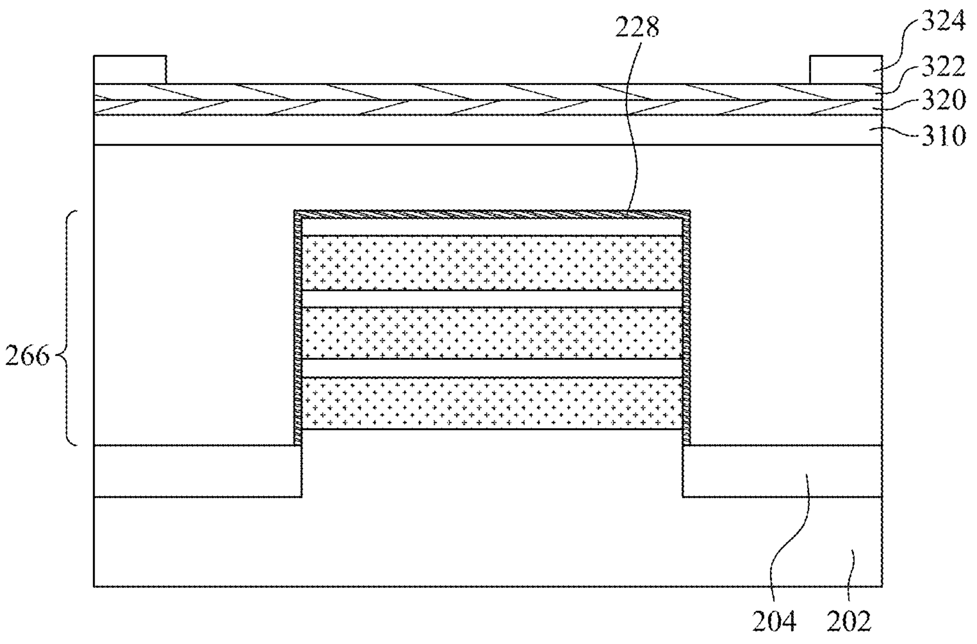
Figure 4A:
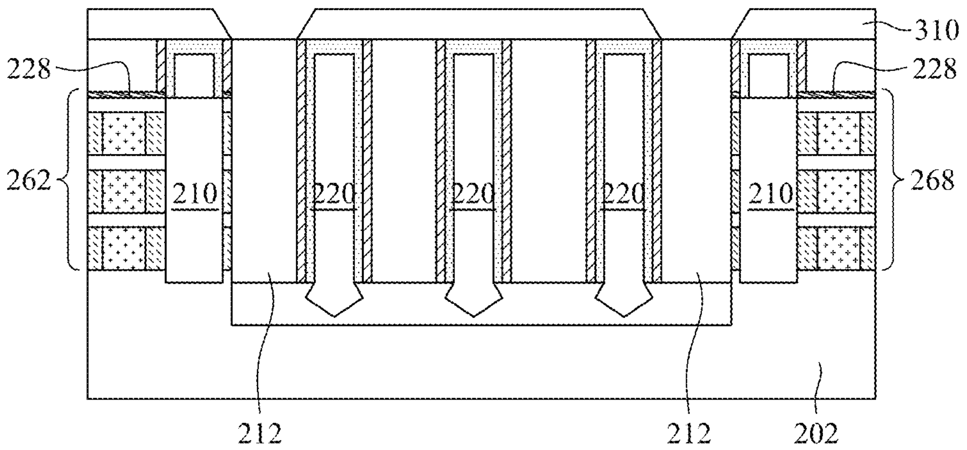
FIGS. 4A-4D are different views of the substrate after patterning the hard mask layer.
Figure 4B:
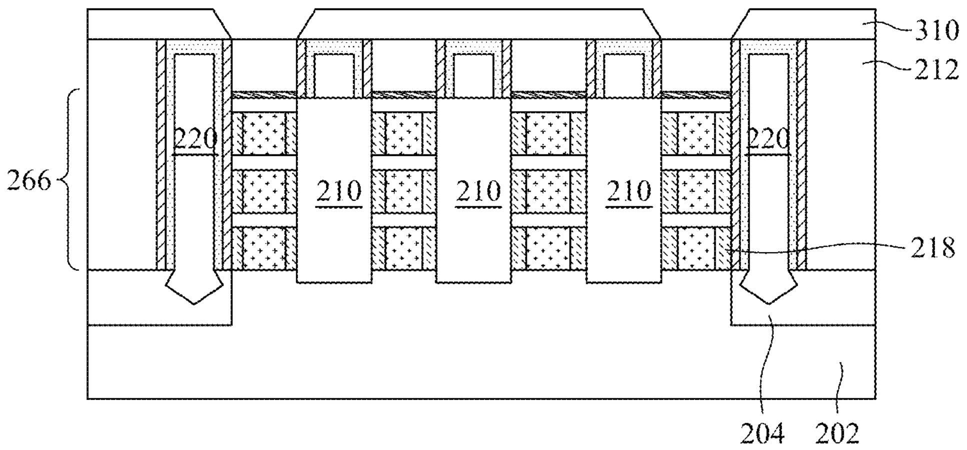
Figure 4C:
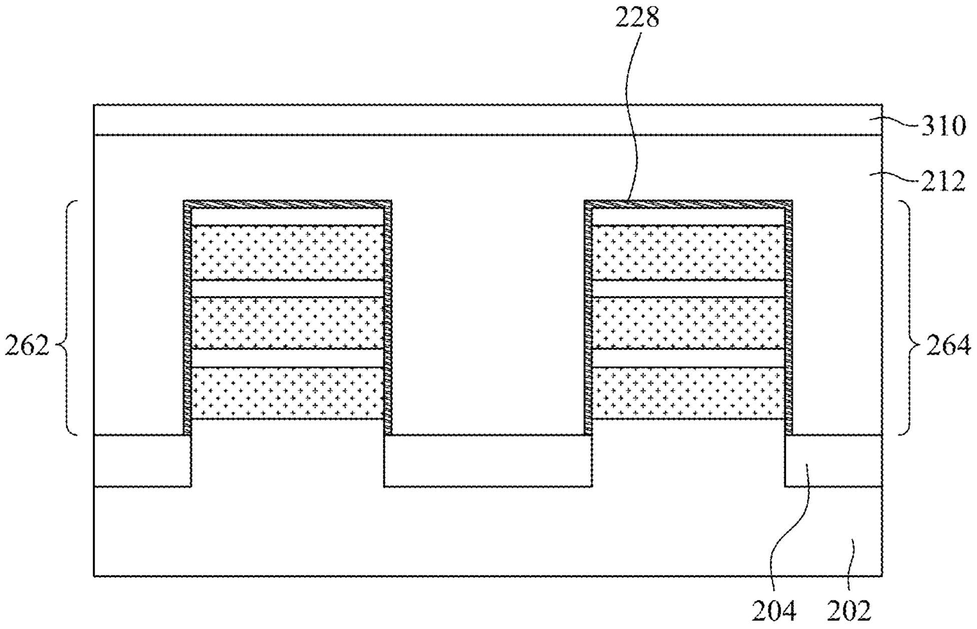
Figure 4D:
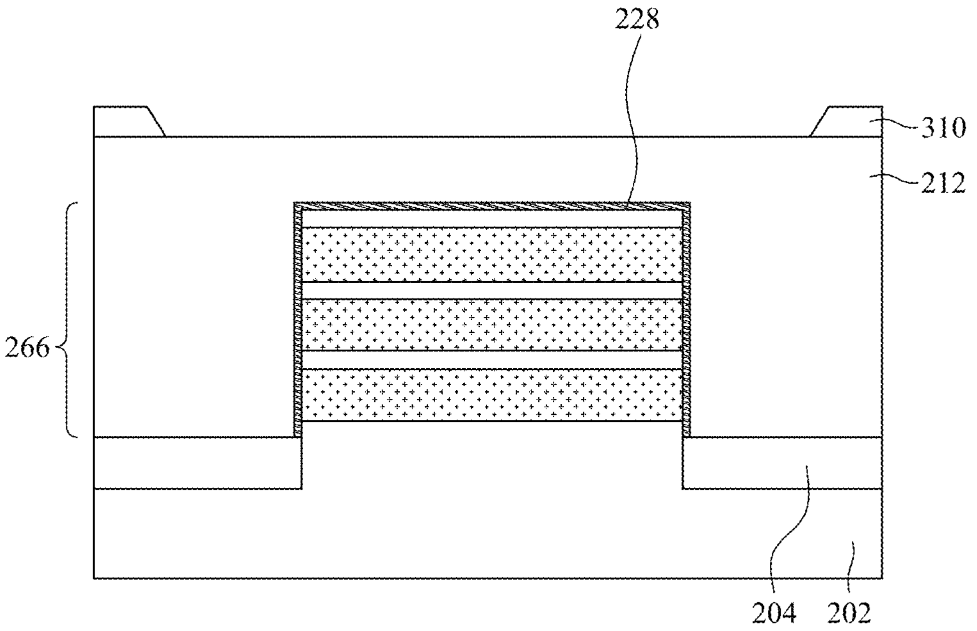

The resulting structure is illustrated in FIGS. 3A-3D. It can be seen that the PR layer 324 is patterned to expose two dummy gate regions 212 in the second region 284, i.e. along line Y2-Y2 of FIG. 2A within or adjacent the jog regions 280. As seen in FIG. 3C, the first fin portion 262 and the second fin portion 264 are not exposed. As seen in FIG. 3D, the third fin portion 266 is exposed. This is only illustrative, and dummy gate regions in the first region 282 and/or the third region 286 could also have been illustrated as being exposed instead.

Next, in step 115 of FIG. 1, etching is performed to etch through the hard mask layer 310 and expose the dummy gate regions 212 within or adjacent the jog regions 280. This may be referred to as Hard Mask Open (HMO). When present, the middle layer 322 and the bottom layer 320 are etched through first, using appropriate etchants. After removal of the bottom layer, the middle layer, and the PR layer, the resulting structure is seen in FIGS. 4A-4D.

Figure 5A:
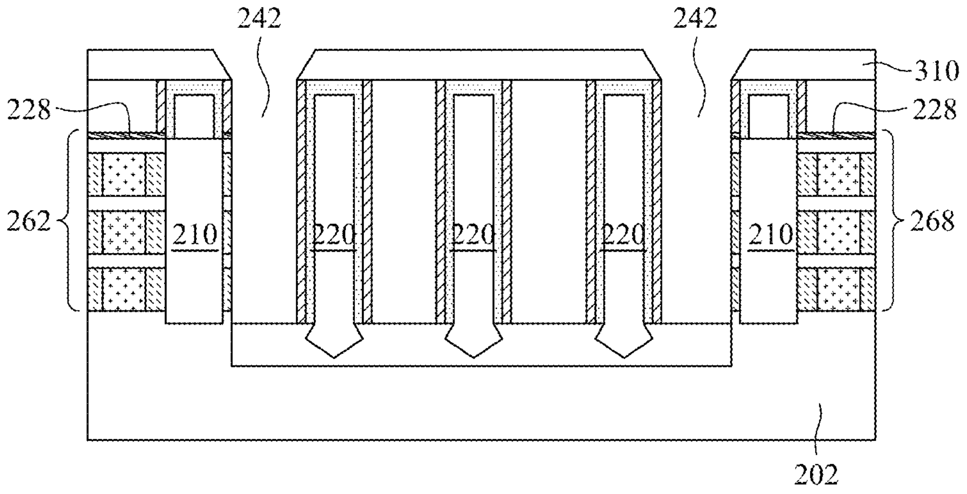
FIGS. 5A-5D are different views of the substrate after exposed dummy gates are removed.
Figure 5B:
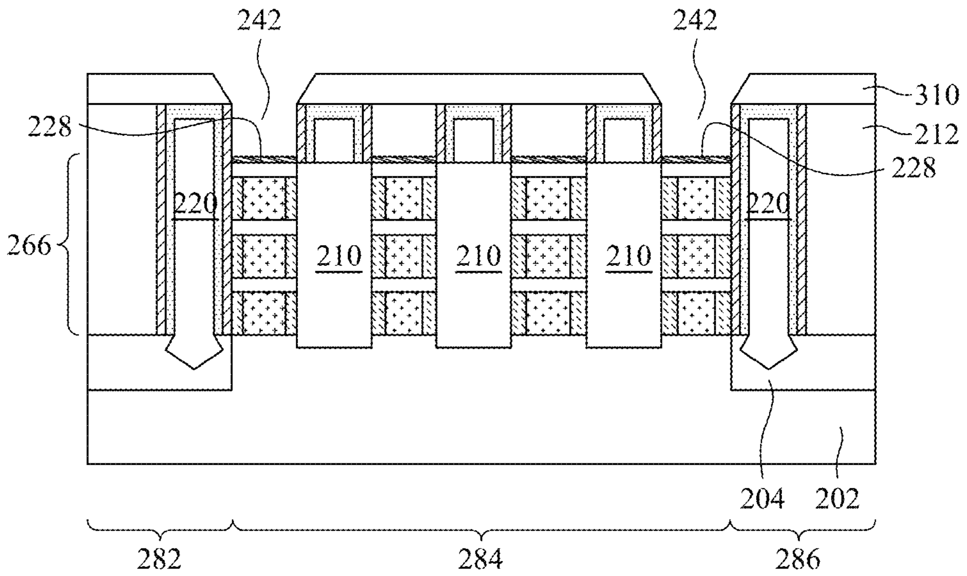
Figure 5C:
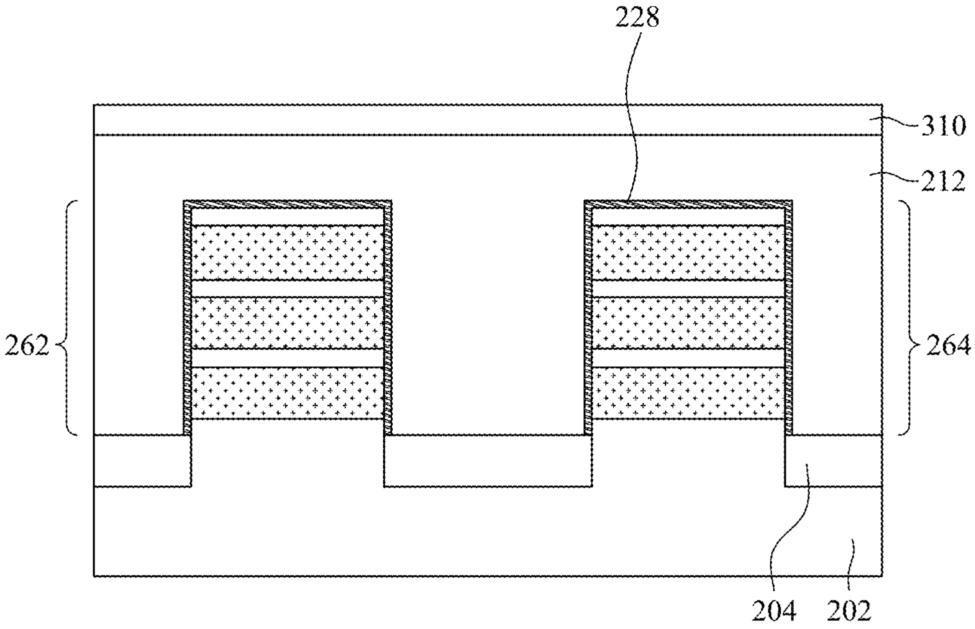
Figure 5D:
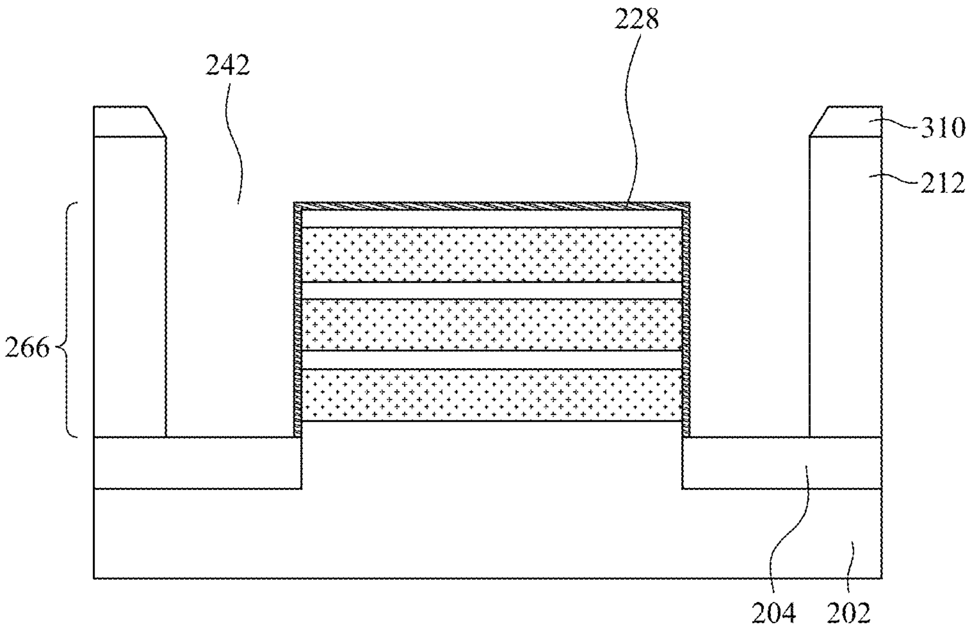

Then, in step 120 of FIG. 1, the exposed dummy gate region(s) is removed by etching. As seen in FIG. 5A, FIG. 5B, and FIG. 5D, the removal of the dummy gate region exposes three sides of the third fin portion 266. Comparing FIG. 5B with FIG. 5C, the removal of the dummy gate region on the sides also extends past the boundaries of the first fin portion 262 and the second fin portion 264. The empty dummy gate region(s) may also be referred to herein an isolation volume 242. When the dummy gate region is formed from polysilicon, suitable etchants may include $BCl_3$, $Cl_2$, $SiCl_4$, HCl, $O_2$, HBr, $SF_6$, and/or $NF_3$, in appropriate combinations and ratios. It is noted that this etching only occurs within or adjacent the jog region(s) 280 (see FIG. 2A), and does not occur over the entire second region 284. It is also noted that in some embodiments, the STI layer may be slightly etched as well and a small recess may be formed.

Figure 6A:
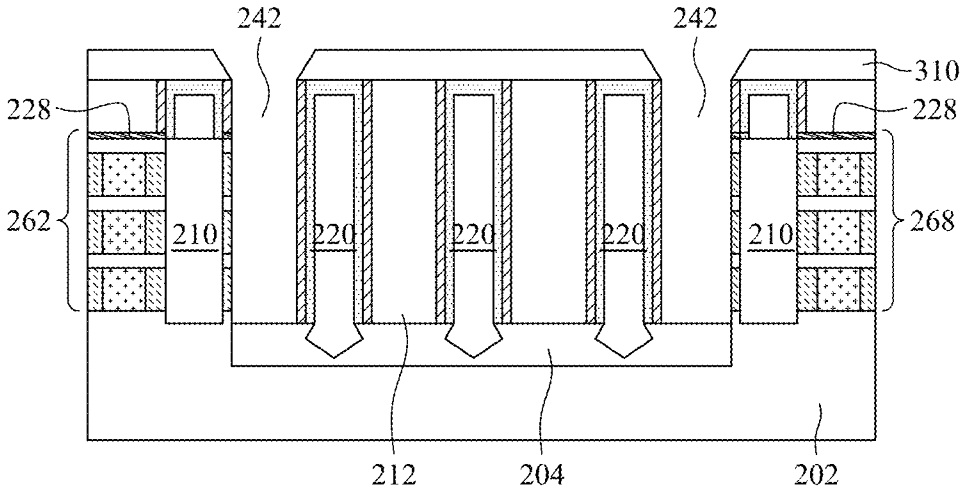
FIGS. 6A-6D are different views of the substrate after exposed dummy oxide layers are removed to obtain an isolation volume.
Figure 6B:
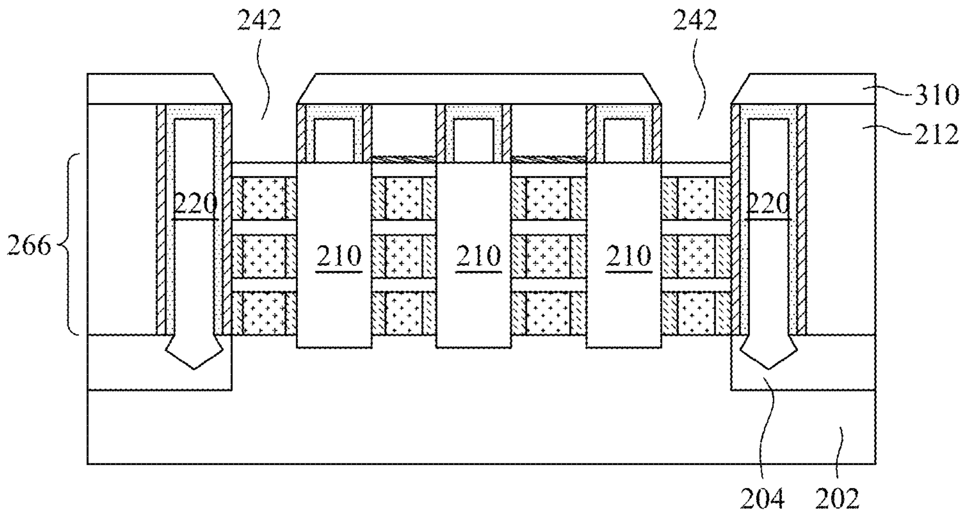
Figure 6C:
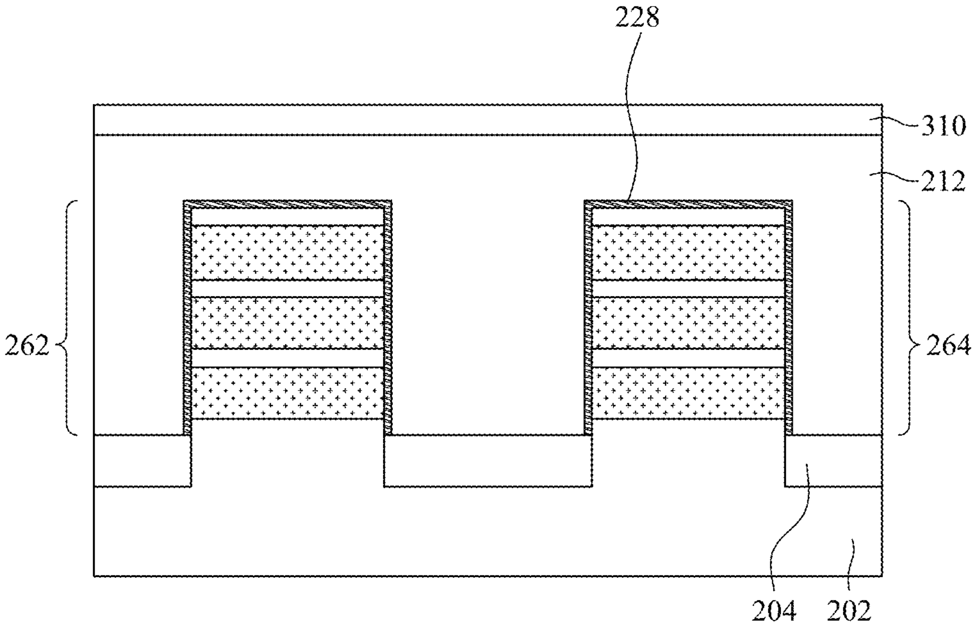
Figure 6D:
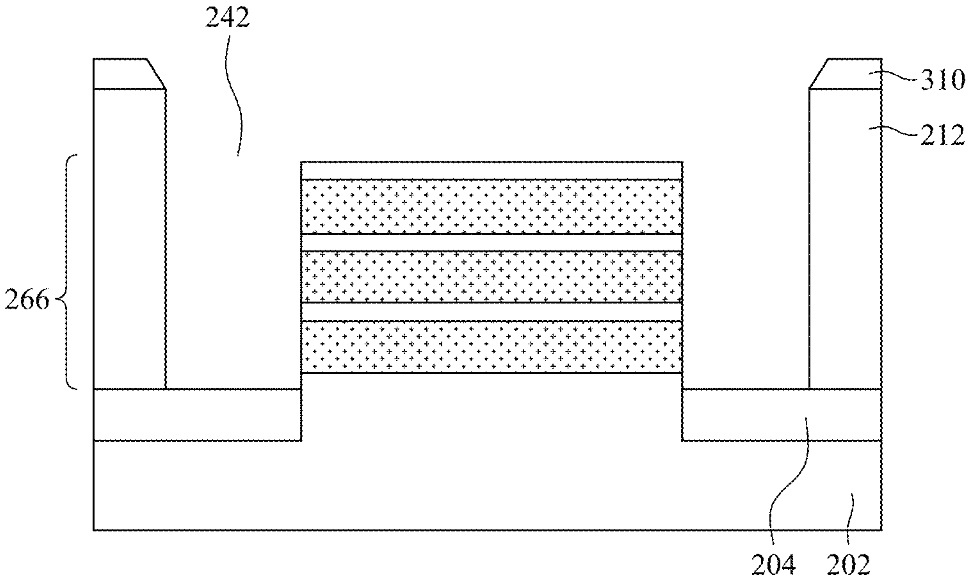

Next, in step 125 of FIG. 1, the dummy oxide is removed. FIGS. 6A-6D show the resulting structure. The removed dummy oxide can be seen in FIG. 6B and FIG. 6D. The fin portions in the first region illustrated in FIG. 6C are not affected as they are protected by the hard mask layer 310.

Figure 7A:
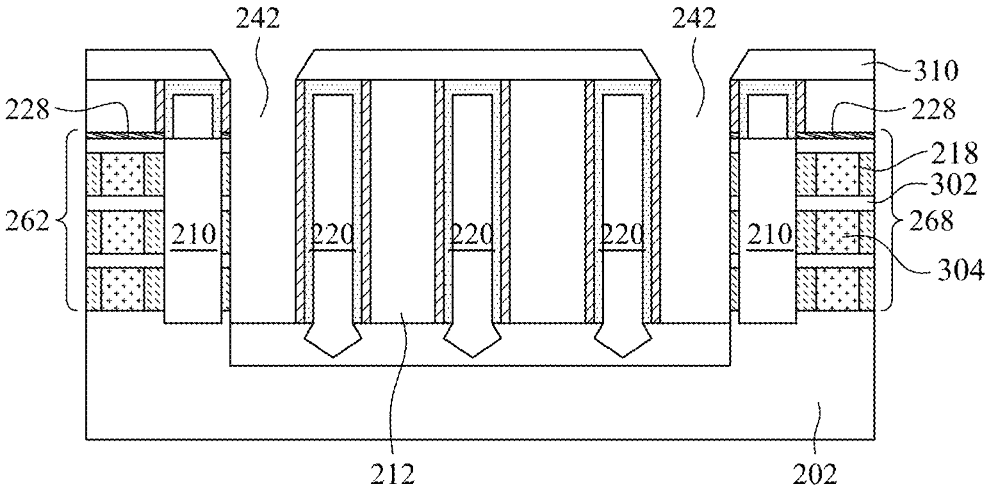
FIGS. 7A-7D are different views of the substrate after exposed portions of the semiconducting fin(s) are removed to form a trench in the substrate.

Then, in step 130 of FIG. 1, etching is performed to remove the exposed semiconducting fin portion 266 and to form a trench 244 in the substrate. FIGS. 7A-7D show the resulting structure. It is noted that FIG. 7A shows the area off to the side of third fin portion 266 is unchanged compared to FIG. 6A. This is expected because the etchants for the semiconducting fin portion 266 do not etch the STI layer 204.

Figure 7B:
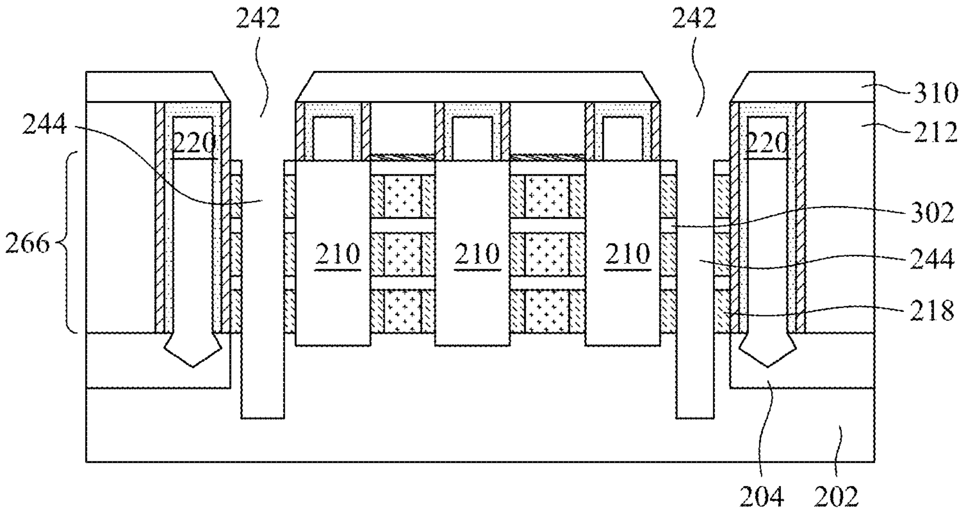
Figure 7C:
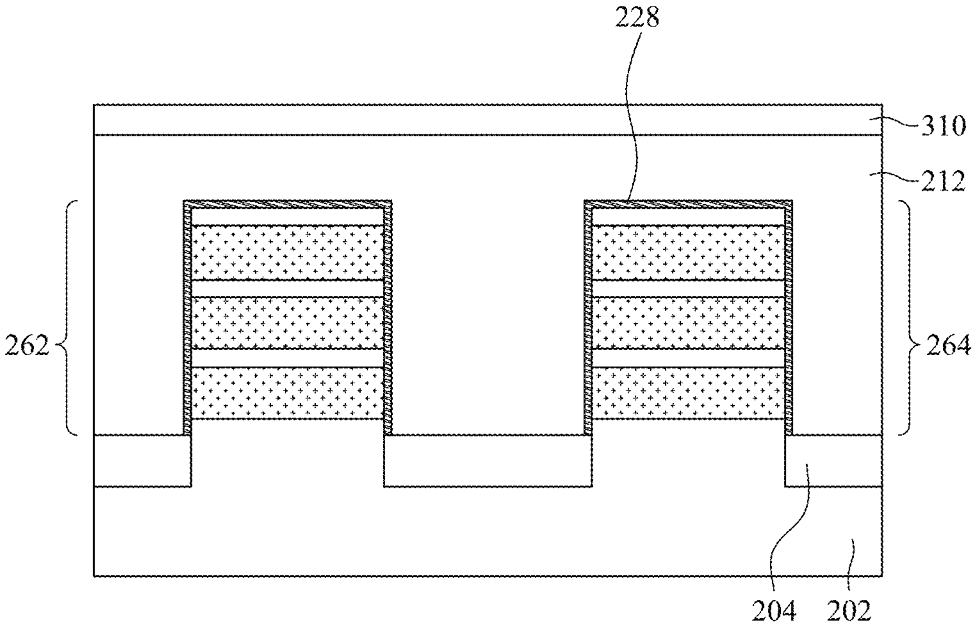
Figure 7D:
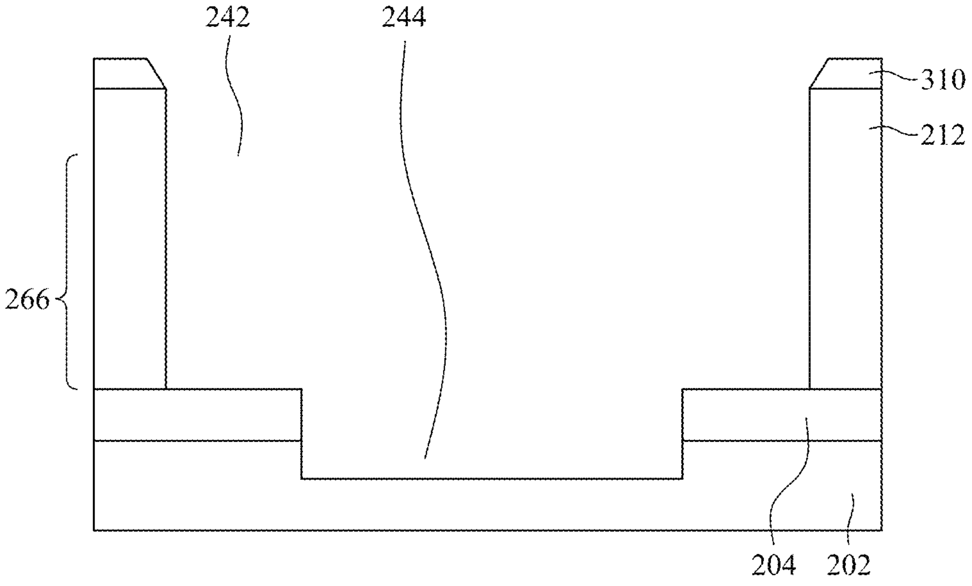
Figure 8A:
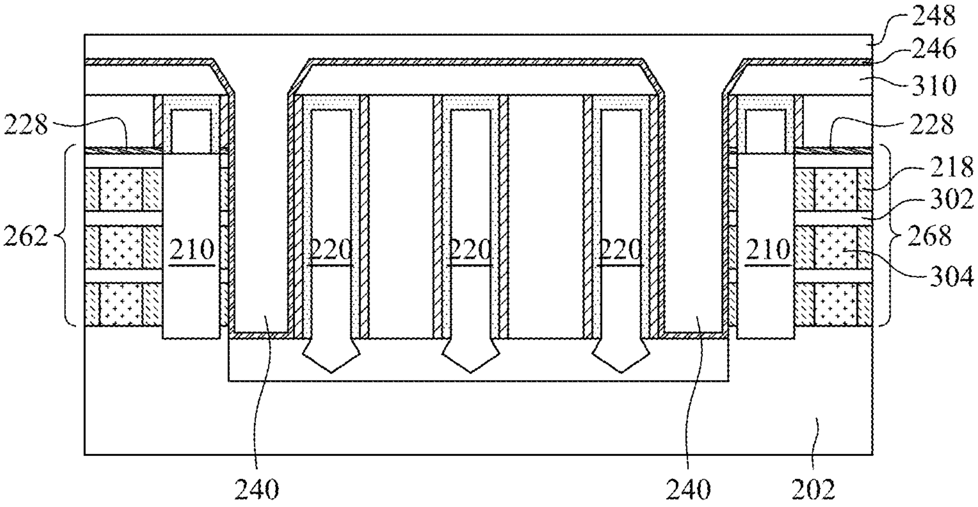
FIGS. 8A-8D are different views of the substrate after the trench and isolation volume are refilled with dielectric material(s) to form an electrically isolating structure.
Figure 8B:
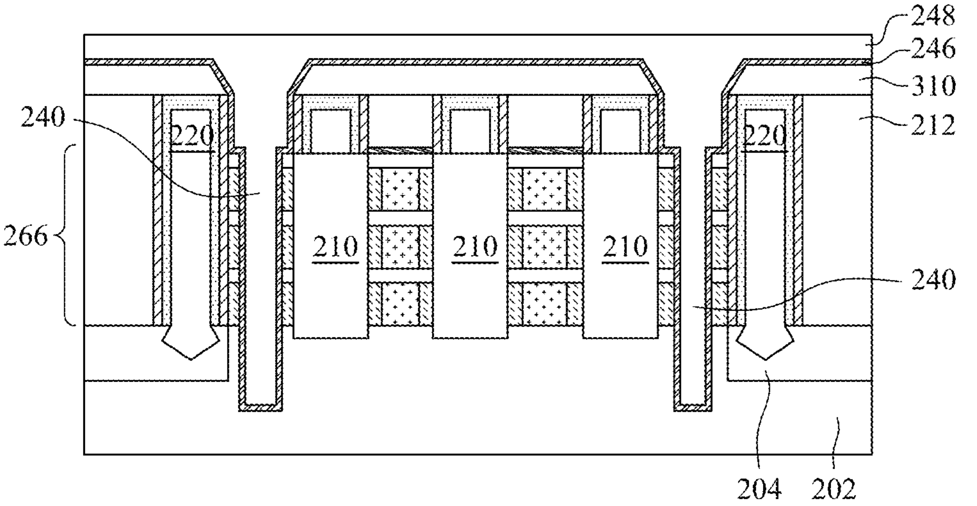
Figure 8C:
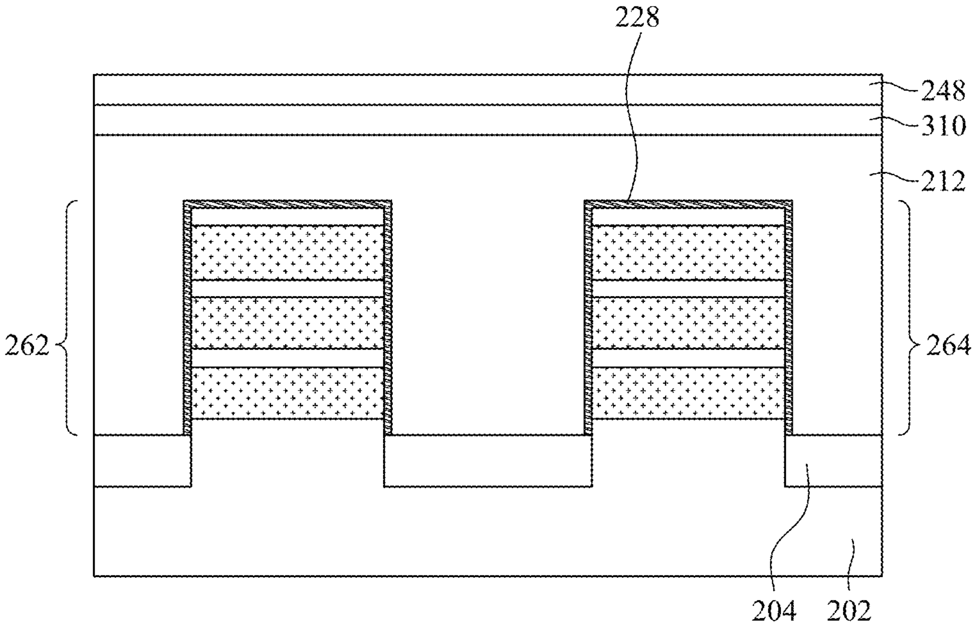
Figure 8D:
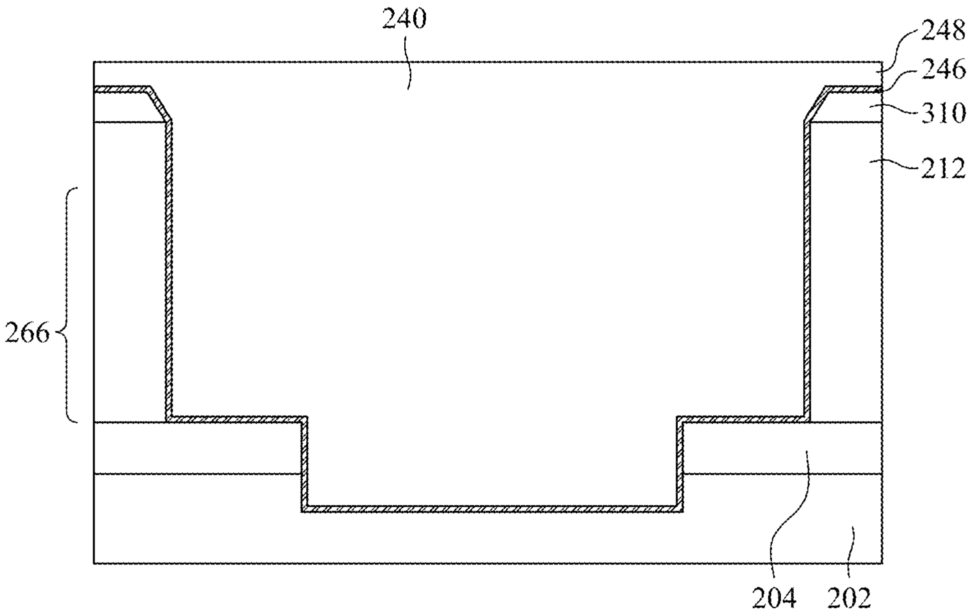
Figure 9A:
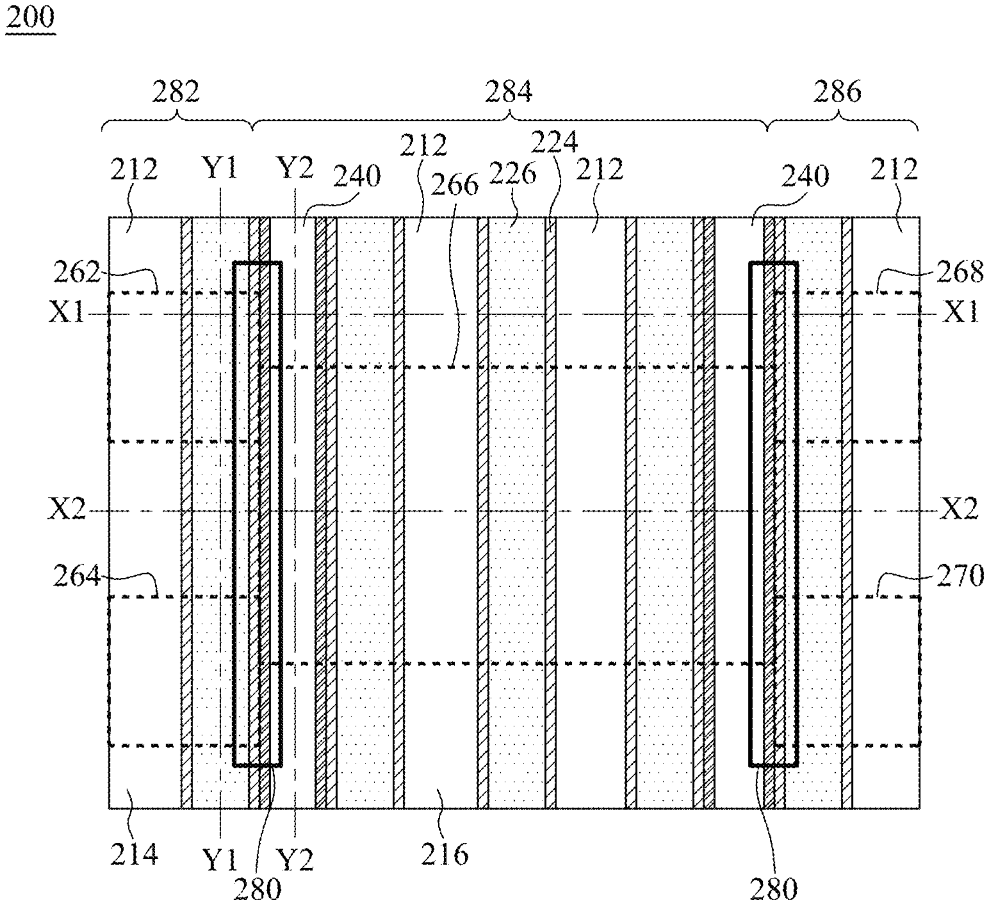
FIGS. 9A-9E are different views of the substrate after a planarizing step.
Figure 9B:
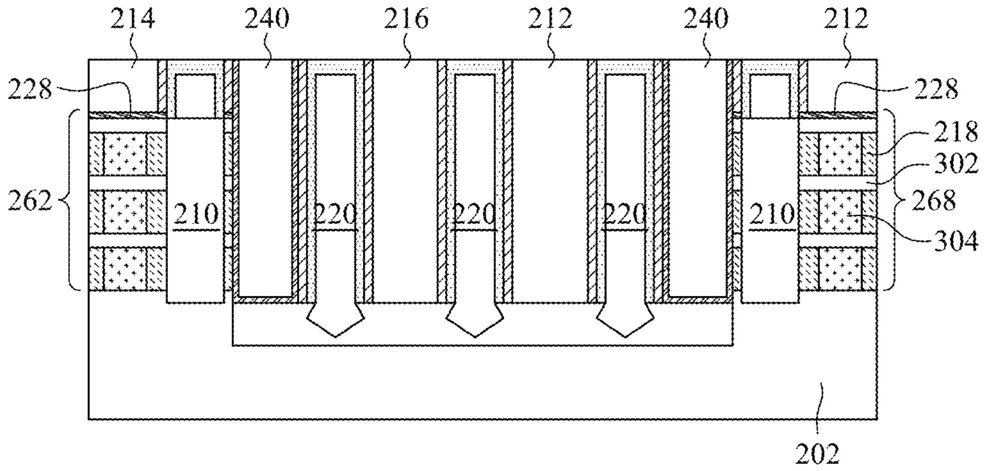
Figure 9C:
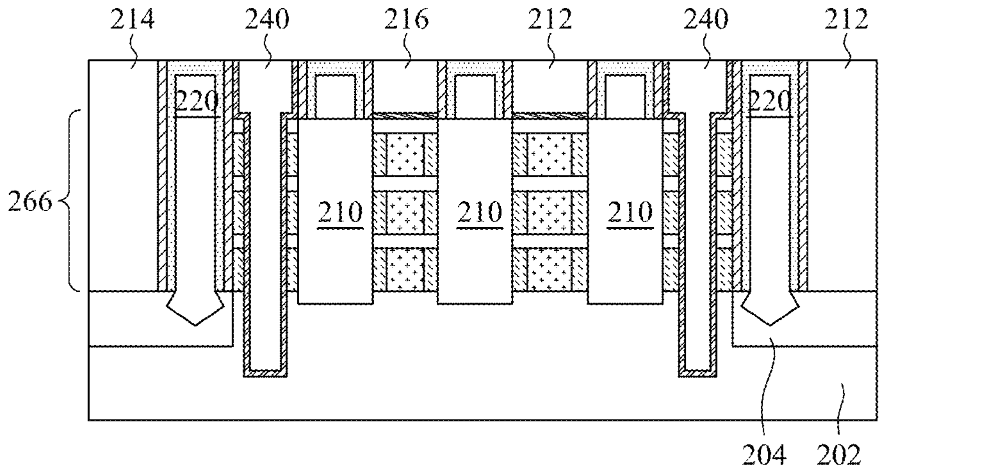
Figure 9D:
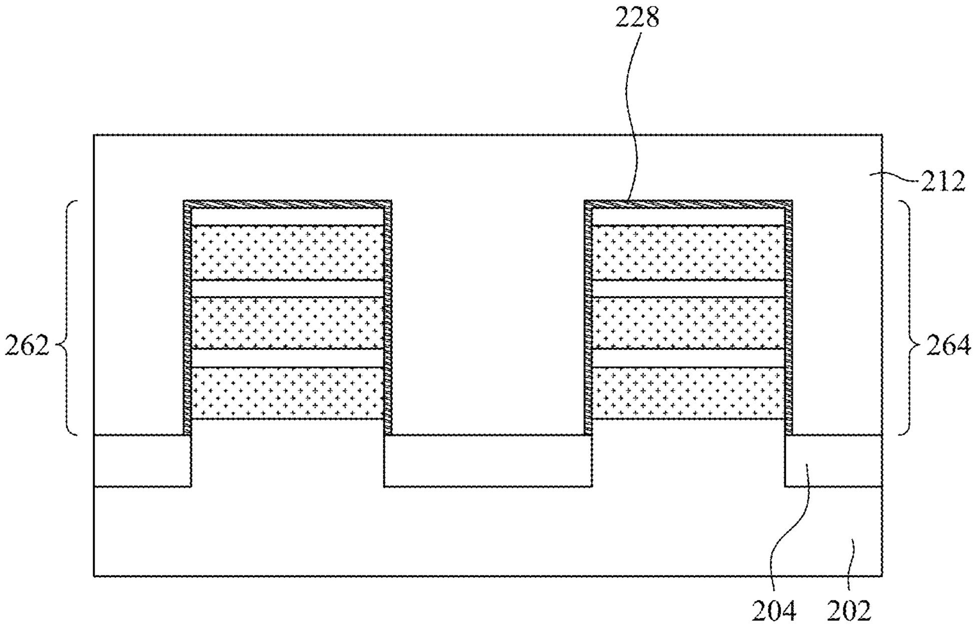
Figure 9E:
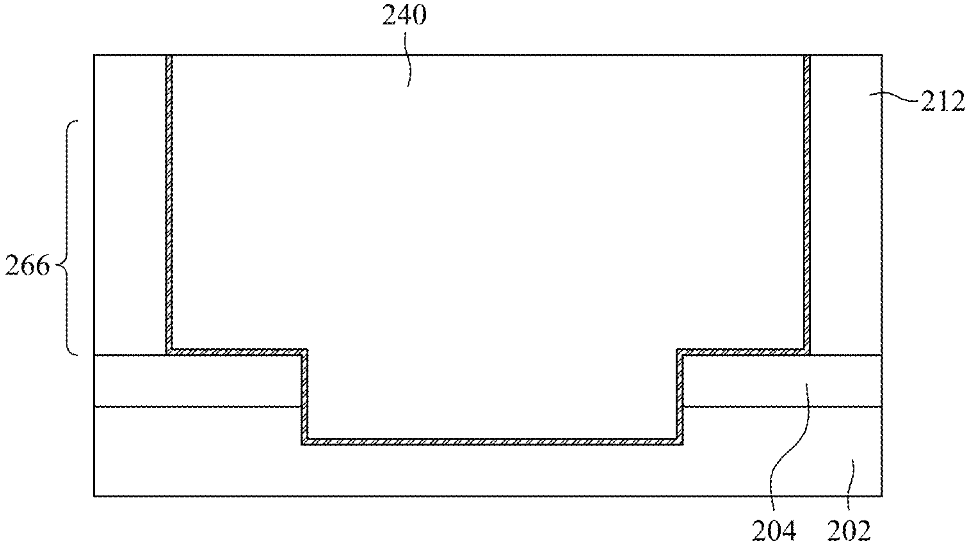

Referring to FIG. 7A and FIG. 7B, it is noted that the etchant for the semiconducting nanosheet 302 and the sacrificial layer 304 does not etch the inner dielectric spacers 218. Thus, there is a protective layer between the trench and the source/drain regions 210 formed from epitaxial silicon (which can be etched by the same etchant for the semiconducting nanosheet).

Then, in step 135 of FIG. 1, the trench 244 and the isolation volume 242 are filled (or refilled) with at least one dielectric material to form the CPODE structure 240 that isolates the first region 282 from the second region 284. As illustrated in the structure of FIGS. 8A-8D, the walls of the trench and the isolation volume are lined with a first dielectric material 246. This may be done, for example, via ALD. In some particular embodiments, the first dielectric material is an oxide, such as a silicon oxide. The trench and the isolation volume are then filled with a second different dielectric material 248. This may be performed by deposition, as illustrated here. In some particular embodiments, the second dielectric material is a nitride, such as silicon nitride. As seen by comparing FIG. 8C and FIG. 8D, the fin portions 262, 264 in the first region are now electrically isolated from the fin portions 266 in the second region by the CPODE structure, which extends beyond the sides of the fin portions 262, 264. Put more broadly, the first region 282 is electrically isolated from the second region 284 by the CPODE structure.

Continuing, then, in step 140 of FIG. 1, the substrate is planarized to remove the overfill dielectric materials and the hard mask layer 310. The resulting structure is illustrated in FIGS. 9A-9E. The remaining dummy gate regions 212 in the first region 282, the second region 284, and the third region 286 are now exposed. For example, a primary dummy gate 214 in the first region is exposed, as is a secondary dummy gate 216 in the second region.

Figure 10A:
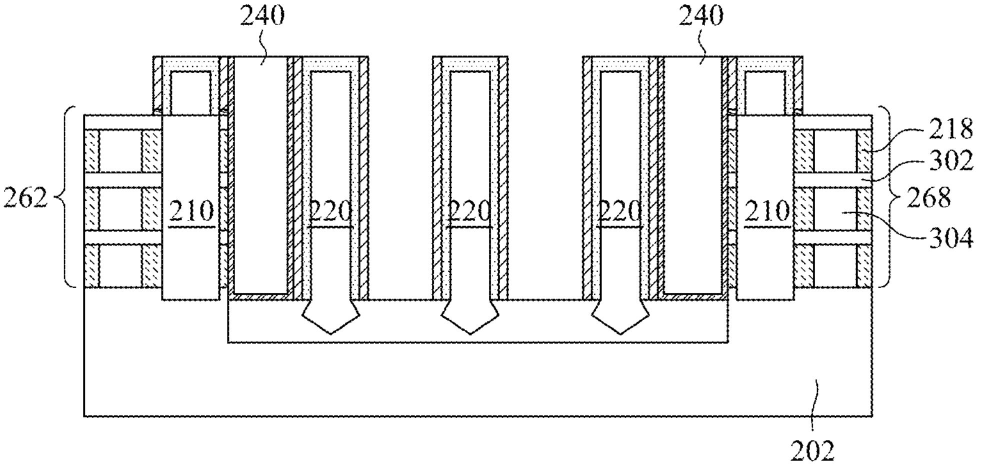
FIGS. 10A-10D are different views of the substrate after exposed dummy gates and sacrificial layers in the semiconducting fin(s) are removed.
Figure 10B:
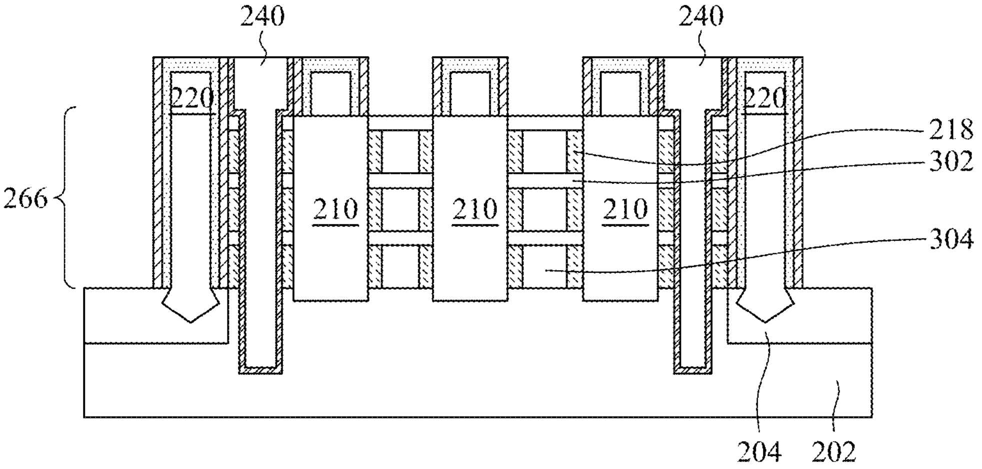
Figure 10C:
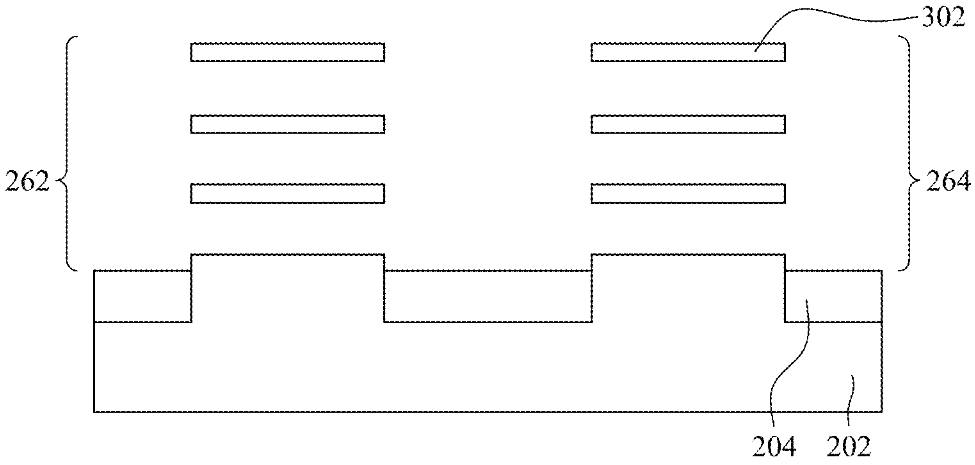
Figure 10D:
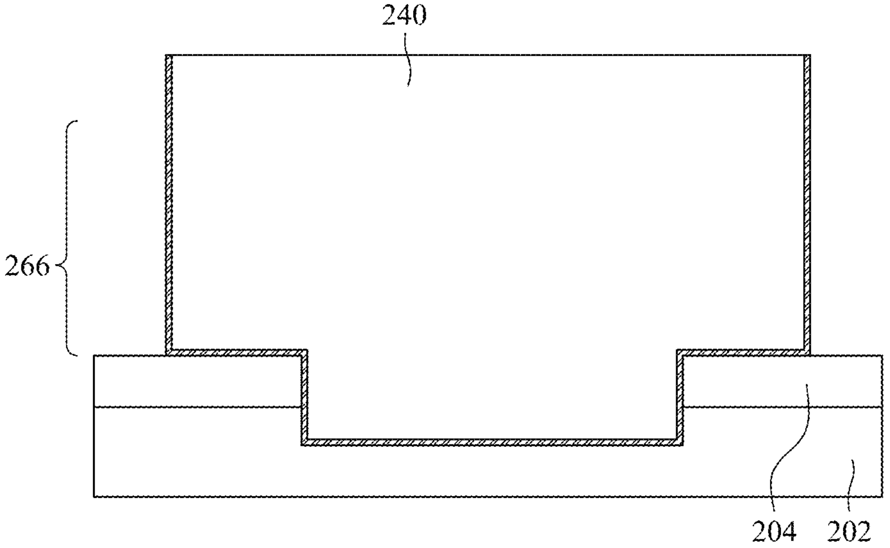

Next, in step 145 of FIG. 1, the dummy gate regions, such as the primary dummy gate 214 and the secondary dummy gate 216, are removed. Any remaining dummy oxide 228 (see FIG. 9C) is also removed. Then, in step 150, the sacrificial layers 304 in the semiconducting fin portions 262, 264, 266, 268, 270 are removed. Both steps are typically performed by etching. It is noted that the sacrificial layers are removed after the CPODE structure is formed. The resulting structure is illustrated in FIGS. 10A-10D. These empty spaces after removing the dummy gate material may be referred to as gate volumes. Referring to FIG. 10C, the semiconducting nanosheets 302 are supported by the adjacent source/drain regions 210 (not visible here), and can also be referred to as semiconducting channels.

Figure 11A:
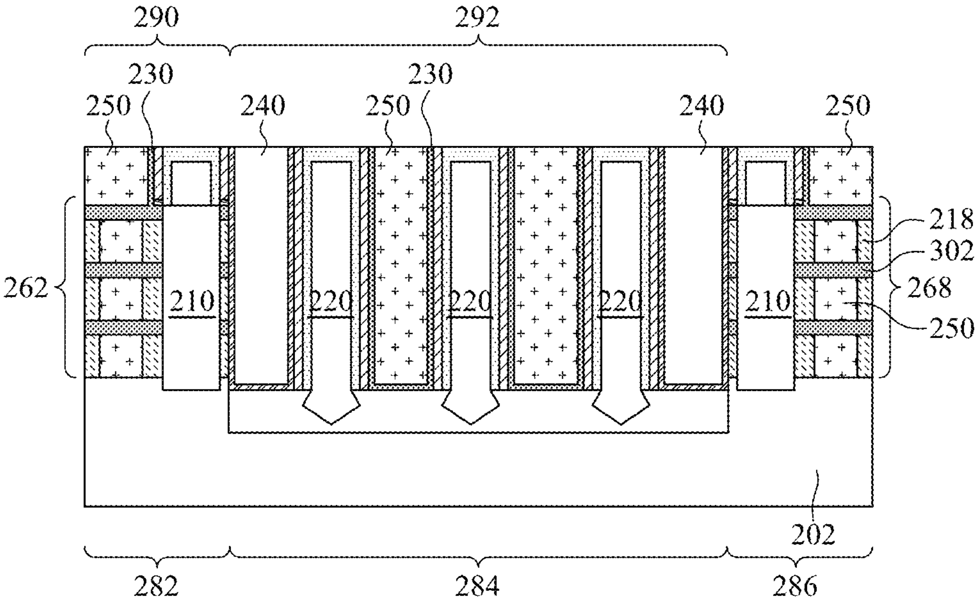
FIGS. 11A-11D are different views of the substrate after gate oxide layers have been deposited upon the semiconducting channels and electrically conductive gate material has been applied to obtain two gate-all-around (GAA) transistors adjacent each other, separated by an electrically isolating structure.
Figure 11B:
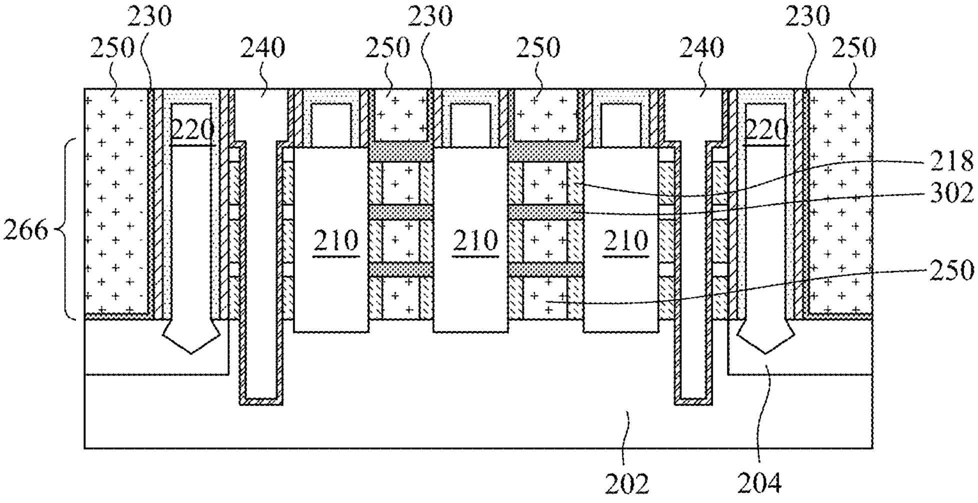
Figure 11C:
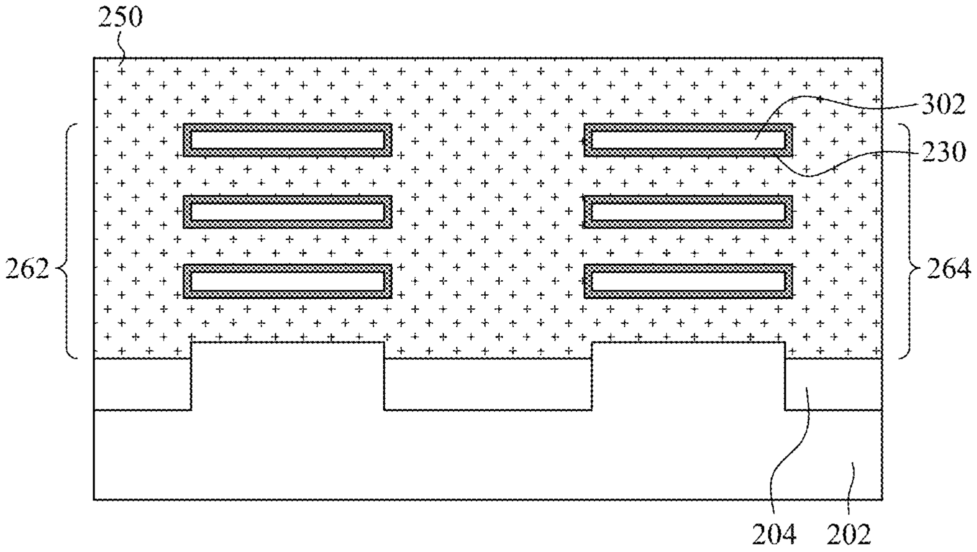
Figure 11D:
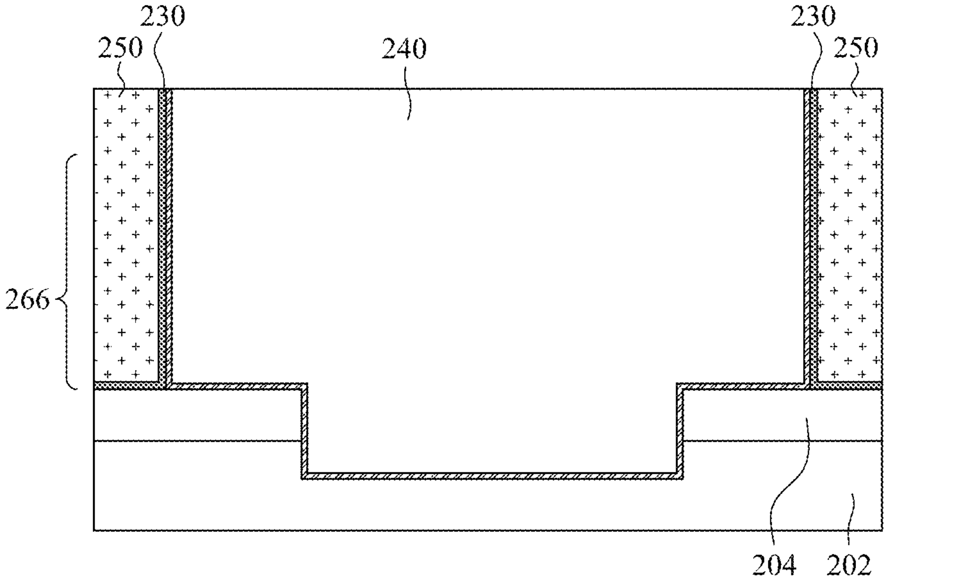

Next, in step 155 of FIG. 1 and as illustrated in FIGS. 11A-11D, a gate oxide layer 230 is applied to the semiconducting nanosheets/channels 302. This may be done, for example, using ALD. Then, in step 160, an electrically conductive gate material is applied to fill the gate volumes and form a gate electrode 250. Any suitable electrically conductive material may be used. In particular embodiments, a metal such as TIN, Pt, Co, Rh, Pd, Ti, Ta, and the like is used. Thus, Gate-All-Around (GAA) transistors 290, 292 are formed in both the first region 282 and the second region 284. As illustrated in FIG. 11B, the second region 284 has three source/drain regions 210 and two gates 250, and thus may be considered to have two transistors. It is noted not all components of transistor 290 are illustrated.

Referring back to FIG. 2A, in some embodiments, the width 267 of the semiconducting fin portion/fin 266 in the second region 284 may be greater than the combined widths 263, 265 of the semiconducting fin portions/fins 262, 264 in the first region 282. Thus, the second region can handle a higher current density and may be considered a high-current region relative to the first region, which would be considered a low-current region.

Figure 12A:
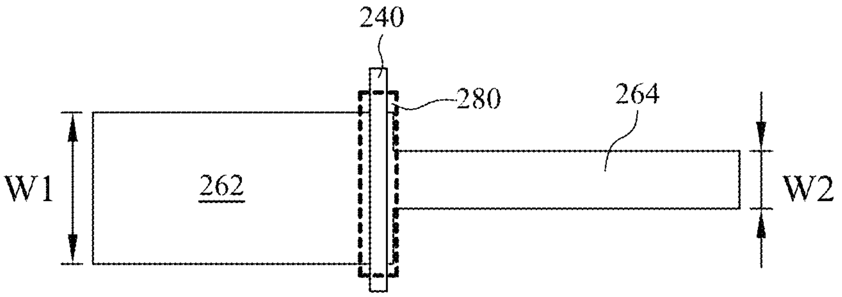
FIGS. 12A-12C illustrate three different combinations of different semiconducting fins/fin portions joined together in a jog region. Three different combinations are illustrated here.
Figure 12B:
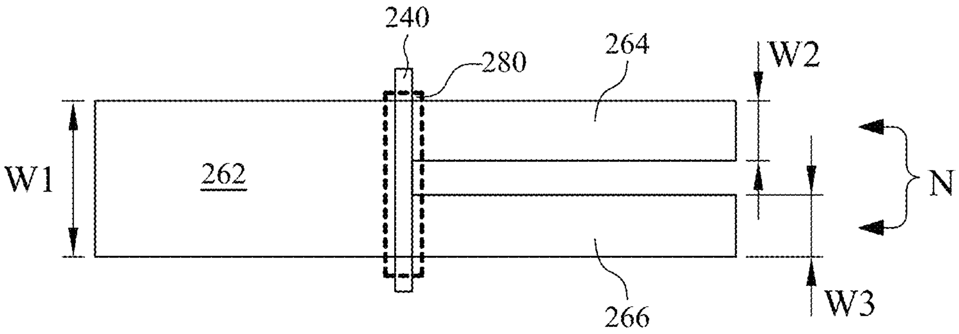
Figure 12C:
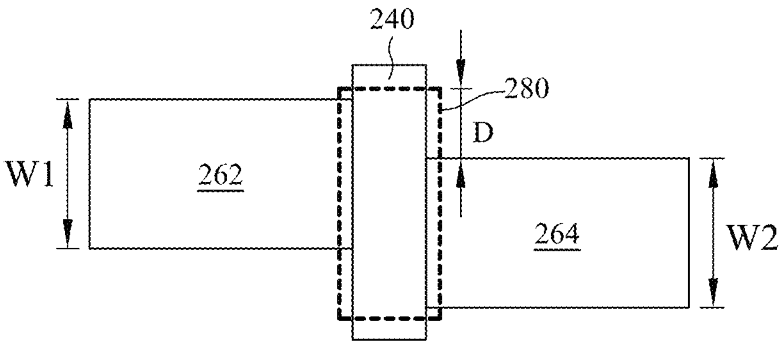

Referring now to FIGS. 12A-12C, the methods of the present disclosure can be applied to electrically isolate any combination of different semiconducting fins/fin portions. Three different combinations are illustrated here.

In FIG. 12A, the first semiconducting fin 262 has nanosheets with a width W1. They are joined at the jog region 280 to a second semiconducting fin 264 which has nanosheets with a different width W2 (W1>W2). Also illustrated here is a CPODE structure 240 that passes through the first semiconducting fin 262 and the nanosheets thereof. Again, the CPODE structure can alternatively pass through the second semiconducting fin 264, or pass through both fins.

FIG. 12B illustrates a combination where one semiconducting fin is joined to multiple semiconducting fins. Here, the first semiconducting fin 262 is joined at one end to a second semiconducting fin 264 and a third semiconducting fin 266. Considered in an alternative manner, one semiconducting fin 262 splits at the jog region 280 into multiple portions 264, 266 in the first region 282, with each portion 264, 266 having a smaller width than the portion 262 of the fin in the second region 284. Here, the CPODE structure 240 is illustrated as passing through the second semiconducting fin 264 and the third semiconducting fin 266.

The first semiconducting fin 262 and its nanosheets have a width W1. Similarly, the second semiconducting fin 264 is designated as having a width W2, and the third semiconducting fin 266 is designated as having a width W3. Here, W1>(W2+W3). Generally the number of multiple semiconducting fins is N≥2.

FIG. 12C illustrates a combination where the first semiconducting fin 262 and the second semiconducting fin 264 have the same width (W1=W2), and the two fins are offset from each other at the jog region 280. The offset difference is indicated with letter D. The CPODE structure 240 is illustrated here as passing through both the first semiconducting fin 262 and the second semiconducting fin 264.

As mentioned above, the sacrificial layers are removed and the gate electrode is formed after the CPODE structure is formed. This means the CPODE structure is formed during a front-end-of-line (FEOL) process, or in other words the CPODE structure is formed before the gate electrode material is applied to form a finished transistor. This avoids possible damage to all source/drain regions that might occur if the CPODE structure is formed in a middle-end-of-line (MEOL) process after gate deposition and the transistor is completed.

Figure 13B:
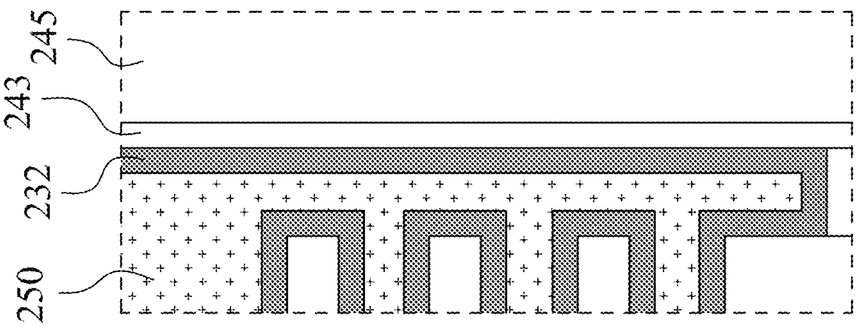
FIG. 13B is a magnified Y-axis cross-sectional view of a portion of the CPODE structure.
Figure 13A:
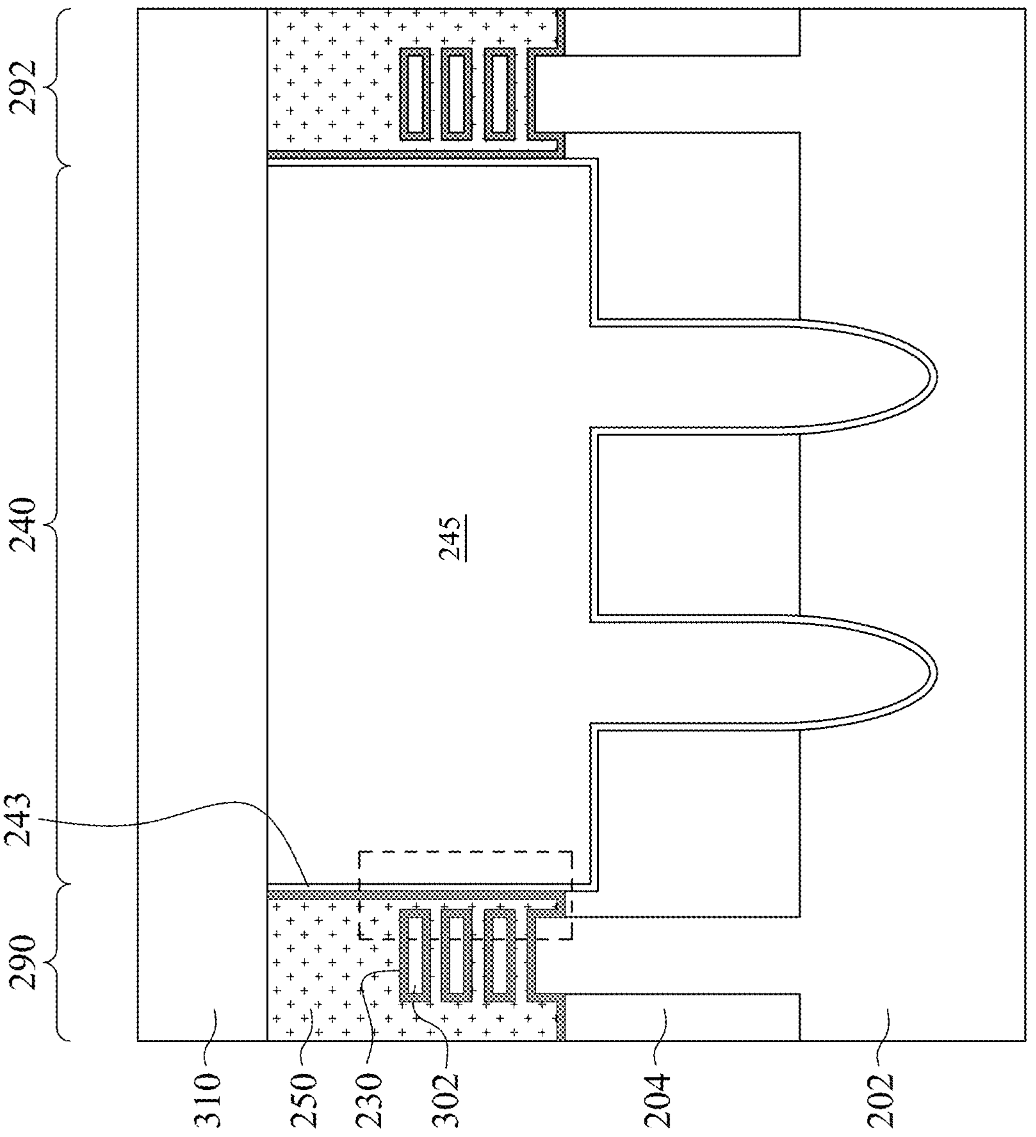
FIG. 13A is a Y-axis cross-sectional view showing two transistors on opposite sides of a CPODE structure formed in a FEOL process.

FIGS. 13A-15B illustrate three different CPODE structures formed in an FEOL process. FIG. 13A is a Y-axis cross-sectional view showing two transistors on opposite sides of a CPODE structure. FIG. 13B is a magnified Y-axis cross-sectional view of a portion of the CPODE structure, as indicated by the dashed rectangle in FIG. 13A. FIGS. 14A-15B are similar views of different structures.

Referring now to FIG. 13A, the CPODE structure 240 is illustrated having a sidewall 243 formed from a first dielectric material and then a volume 245 formed from a second dielectric material. The CPODE structure extends through the STI layer 204 and into the substrate 202. A first transistor 290 is located on one side of the CPODE structure, and a second transistor 292 is located on the other side of the CPODE structure. Each transistor includes semiconducting channels 302 which are surrounded by a gate oxide layer 230. Gate material 250 is present, as is a hard mask layer 310. Referring now to the magnified view of FIG. 13B, the gate oxide layer 230 is also present as a vertical sidewall 232 that directly contacts the CPODE structure 240. Referring back to FIGS. 11A-11D, the presence of the gate oxide layer 232 against the CPODE sidewall 243 indicates the CPODE structure was formed in a FEOL process before the gate oxide layer 230 was applied.

Figure 14B:
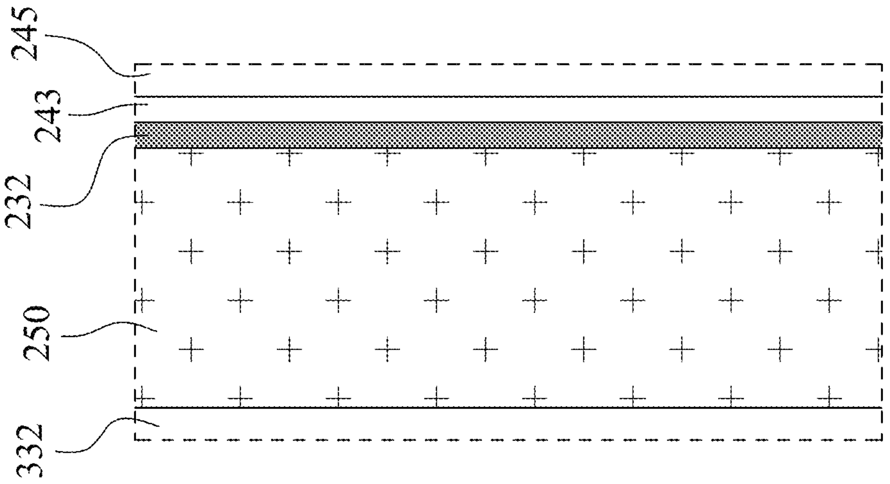
FIG. 14B is a magnified Y-axis cross-sectional view of a portion of the CPODE structure.
Figure 14A:
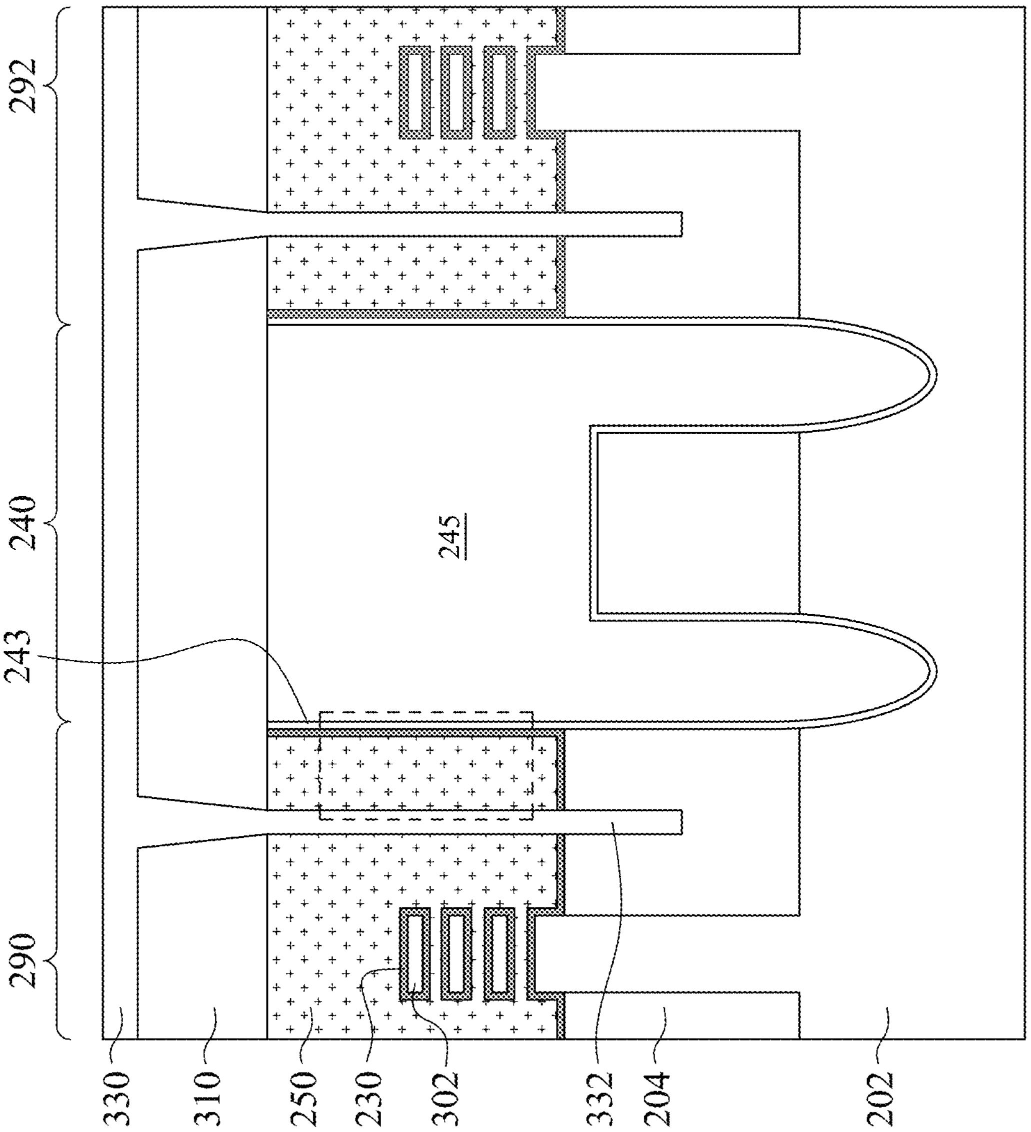
FIG. 14A is a Y-axis cross-sectional view showing two transistors on opposite sides of a CPODE structure formed in a FEOL process and a cut metal gate (CMG) structure formed afterwards.

Referring now to the second structure of FIGS. 14A-14B, this structure includes a cut metal gate (CMG) structure 330. The CMG structure is formed after the metal gate is formed. The metal gate is cut (e.g., by etching) to separate the metal gate into two or more portions. Each portion functions as a metal gate for an individual transistor. A dielectric material is subsequently filled into trenches between adjacent portions of the metal gate. These trenches form the CMG structure.

In FIGS. 14A-14B, the CMG trenches 332 are located between the CPODE structure 240 and the semiconducting channels 302 of the two transistors 290, 292. However, as seen in the magnified view of FIG. 14B, the gate oxide layer is still present as a vertical sidewall 232 that directly contacts the CPODE sidewall 243. Again, this indicates the CPODE structure was formed in a FEOL process.

Figure 15B:
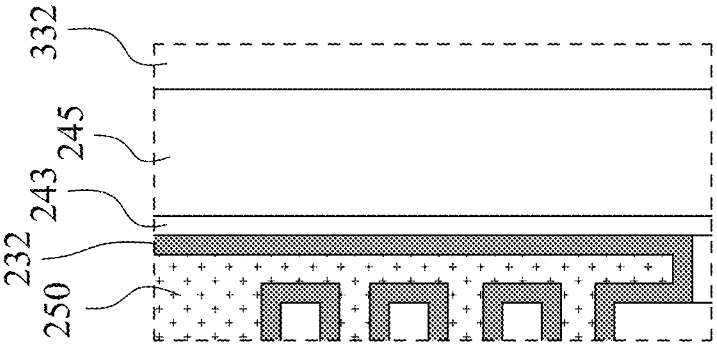
FIG. 15B is a magnified Y-axis cross-sectional view of a portion of the CPODE structure.
Figure 15A:
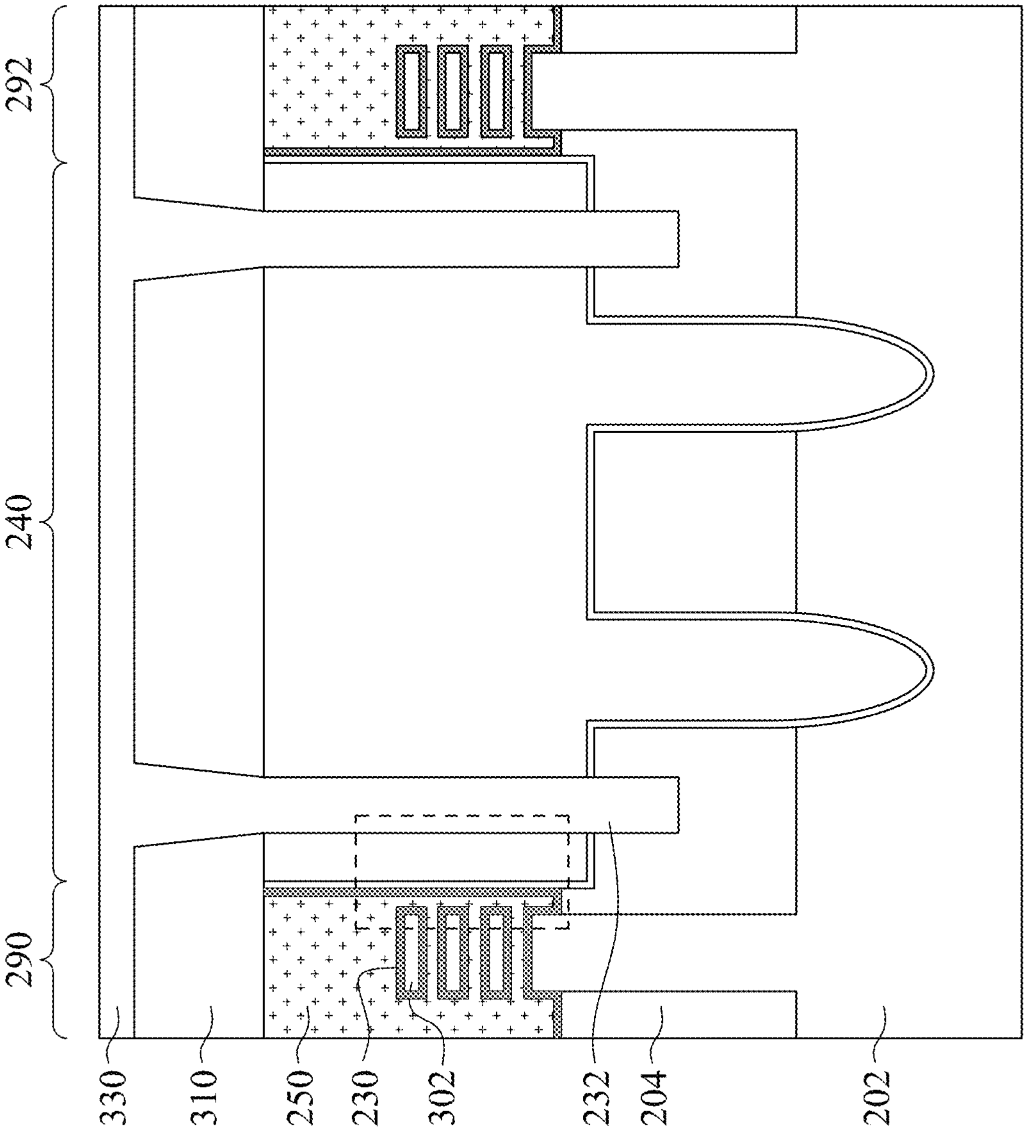
FIG. 15A is a Y-axis cross-sectional view showing two transistors on opposite sides of a CPODE structure formed in a FEOL process and a cut metal gate (CMG) structure formed afterwards in a different location.

Finally, in the third structure of FIGS. 15A-15B, which also has a CMG structure 330, the CMG trenches 332 are located within the CPODE structure 240, but are still located between the semiconducting channels 302 of the two transistors 290, 292. The magnified view of FIG. 15B shows the gate oxide layer 230 is still present as a vertical sidewall 232 that directly contacts the vertical CPODE sidewall 243, indicating formation of the CPODE structure in a FEOL process.

Figure 16:
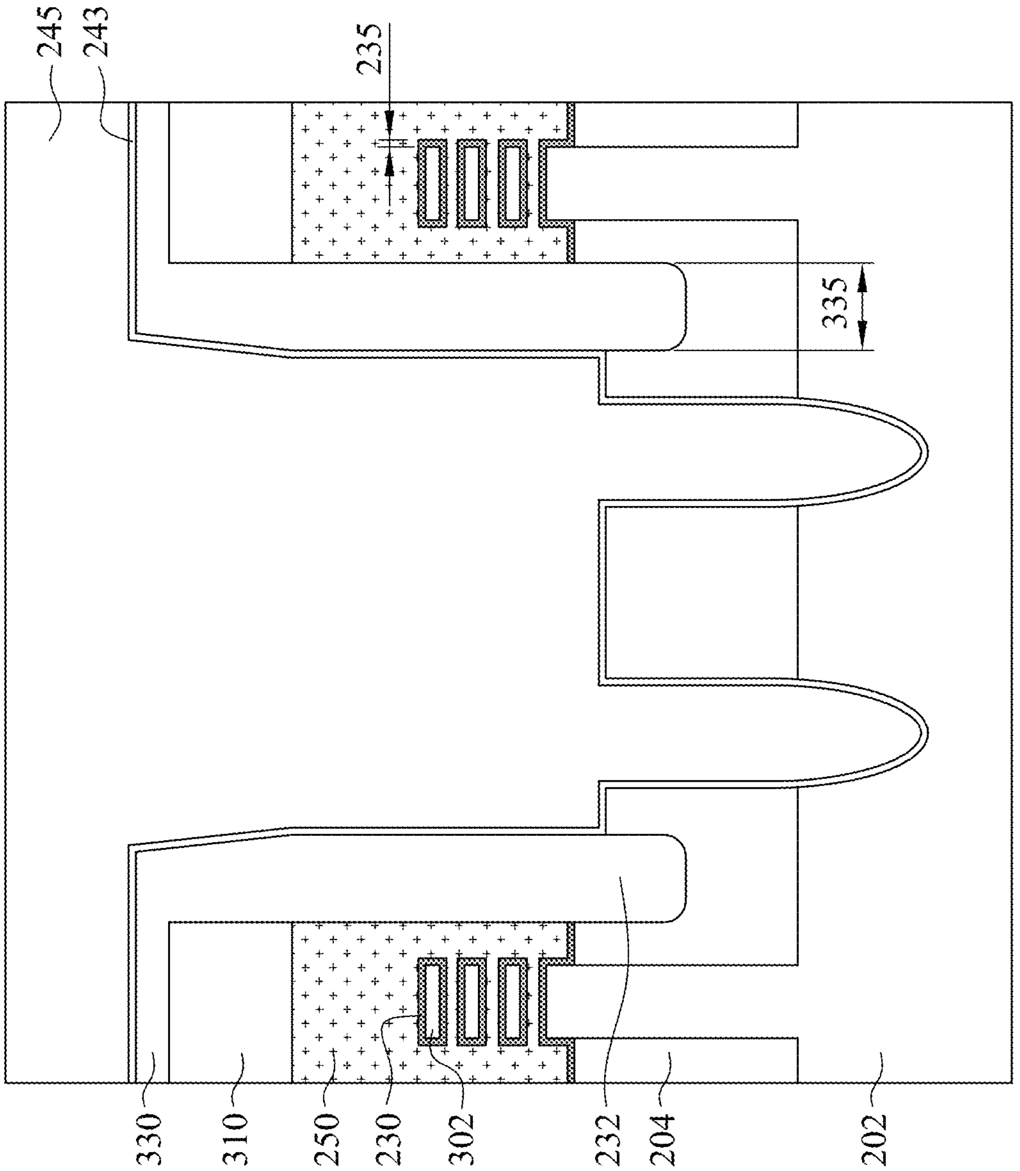
FIG. 16 is a Y-axis cross-sectional view of a comparative example in which the CPODE structure is formed in a MEOL process instead of a FEOL process.

FIG. 16 is a Y-axis cross-sectional view of a comparative example showing the structure when the CPODE structure is formed after the gate electrode has been formed, i.e. a MEOL process. A CMG structure 330 is also present here. The material making up the gate oxide layer 230 does not contact the CPODE structure 240 at all. Rather, the CPODE structure 240 directly contacts the CMG structure 330. In addition, as can be seen here, the CMG trench 332 has a greater vertical width 335 than the width 235 of the gate oxide layer 230.

The methods of the present disclosure have several advantages. First, they permit wide nanosheets and narrow nanosheets to be integrated into a single manufacturing step, without the need to define them in separate steps. Second, they reduce or prevent damage to the epitaxial silicon structures (i.e. source/drain regions) that could otherwise occur when building an electrical isolation structure to isolate the wide nanosheets from the narrow nanosheets, at the minimum reducing the number of epitaxial silicon structures which are damaged. Third, the methods are applicable to jog structures, increasing the efficiency of area usage.

Additional processing steps may be performed to obtain semiconductor devices containing the adjacent transistors containing a jog region that are separated by the CPOE structure. The semiconductor devices might be used in various applications such as BCD (Bipolar-CMOS-DMOS) circuits for driving discrete high voltage components; drivers for LCD, OLED, AMOLED, or QLED display panels; image sensors that can be used in systems such as mobile telephones, facial recognition systems, or as motion sensors for automotive applications, security applications, energy efficiency, etc.; power management devices that control the flow and direction of electrical power; and/or image signal processors (ISP).

The present disclosure thus relates, in some embodiments to methods for isolating a first region from a second region on a substrate. A dummy gate in a jog region between the first region and the second region is removed to expose a portion of a semiconducting fin and form an isolation volume. Etching is performed to remove the exposed portion of the semiconducting fin and create a trench in the substrate. The trench and the isolation volume are then filled with at least one dielectric material to form a CPODE structure that isolates the first region from the second region.

Also disclosed in various embodiments are methods for isolating two adjacent transistors. A substrate is received which has a first semiconducting fin on a first region and a second semiconducting fin on a second region. The first semiconducting fin and the second semiconducting fin contact each other at a jog region. Each semiconducting fin comprises alternating layers of a semiconducting nanosheet and a sacrificial nanosheet. A dummy gate within or adjacent the jog region is removed to expose a portion of the first semiconducting fin and form an isolation volume. Etching is performed to remove the exposed portion of the first semiconducting fin and create a trench in the substrate. The trench and the isolation volume are filled with at least one dielectric material to form a CPODE structure between the first region and the second region. The substrate is then planarized to expose a primary dummy gate in the first region and a secondary dummy gate in the second region. The primary dummy gate, the secondary dummy gate, and the sacrificial layers are removed, forming a gate volume in the first region and a gate volume in the second region. An electrically conductive material is deposited in the gate volume in the first region and the gate volume in the second to form two adjacent transistors electrically isolated from each other by the CPODE structure.

Also disclosed in various embodiments are semiconductor devices that comprise a substrate. The substrate has a first semiconducting fin on a first region and a second semiconducting fin on a second region. The first semiconducting fin and the second semiconducting fin contact each other at a jog region. A dielectric isolation structure is present between the first region and the second region within or adjacent the jog region.

The methods, systems, and devices of the present disclosure are further illustrated in the following non-limiting working example, it being understood that the example is intended to be illustrative only and that the disclosure is not intended to be limited to the materials, conditions, process parameters and the like recited herein.

EXAMPLE

Figure 17:
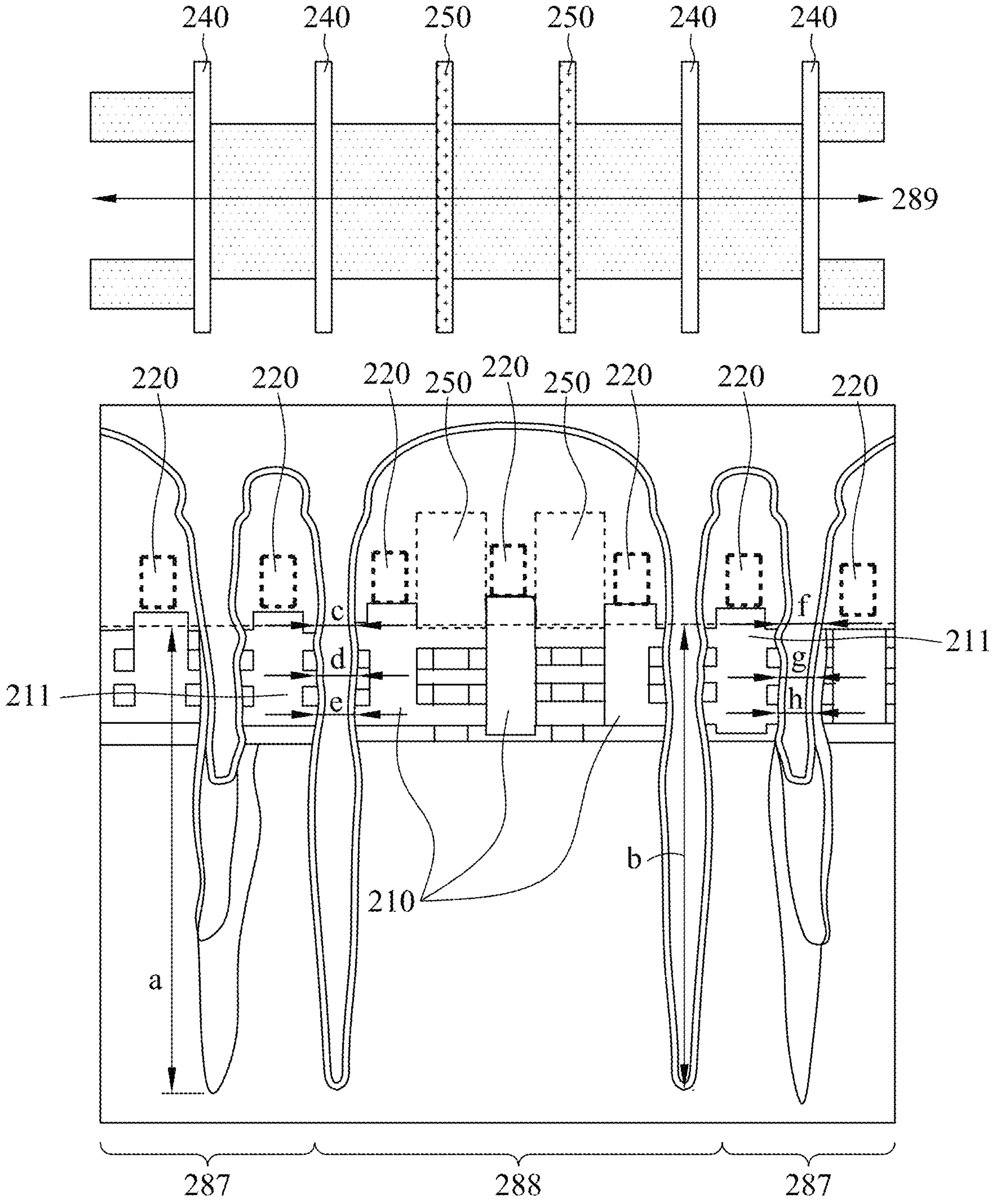
FIG. 17 is an illustration of an example CPODE structure formed according to the methods of the present disclosure.

Several wafers were prepared with CPODE structures that were made according to the methods of the present disclosure. FIG. 17 is a line drawing of such a CPODE structure. As indicated in the top portion of FIG. 17, there are two side regions 287 and a center region 288. Two metal gates 250 are present in the center region. Three source/drain regions 210 are also present, with ILD regions 220 above them. Two separate CPODE structures 240 were made on either side of the center region. One CPODE structure 240 cuts through the side region 287, and one CPODE structure 240 cuts through the center region 288. There is a dummy source/drain region 211 located between the two CPODE structures 240. ILD regions 220 are also visible in the side regions.

The bottom portion of FIG. 17 is through line 289. The depth of the CPODE structure 240 cutting through the side region is indicated with the letter a. The depth of the CPODE structure 240 cutting through the center region is indicated with the letter b.

The semiconducting channel in this example is formed from three nanosheets. The critical dimension (CD) of the CPODE structure cutting through the center region at the level of the top nanosheet is indicated with the letter c. The critical dimension of the CPODE structure cutting through the center region at the level of the middle nanosheet is indicated with the letter d. The critical dimension of the CPODE structure cutting through the center region at the level of the bottom nanosheet is indicated with the letter e.

The critical dimension of the CPODE structure cutting through the side region at the level of the top nanosheet is indicated with the letter f. The critical dimension of the CPODE structure cutting through the side region at the level of the middle nanosheet is indicated with the letter g. The critical dimension of the CPODE structure cutting through the side region at the level of the bottom nanosheet is indicated with the letter h.

The depth of each CPODE structure should be a minimum of 180 nanometers (nm). Ideally, a=b. The CD of the CPODE should not be greater than 20 nm, or else damage might occur to the epitaxial silicon (i.e. source/drain) regions. Ideally, c=f, d=g, and e=h.

Measurements of the CPODE structures were made, and the results are presented in the following table:

| Value | Item | Average (nm) | Max (nm) | Min (nm) |
|---|---|---|---|---|
| a | Depth | 196.9 | 202.7 | 191.1 |
| b | Depth | 199.6 | 212.2 | 192.6 |
| c | Top Sheet CD | 17.2 | 18.6 | 16.5 |
| d | Middle Sheet CD | 16.1 | 17.1 | 15.5 |
| e | Bottom Sheet CD | 15.2 | 16.1 | 14.0 |
| f | Top Sheet CD | 17.7 | 18.6 | 16.1 |
| g | Middle Sheet CD | 17.2 | 18.9 | 15.9 |
| h | Bottom Sheet CD | 16.9 | 18.0 | 16.1 |

As can be seen from the table, all results met the minimum requirements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for isolating a first region from a second region on a substrate, comprising:

removing a dummy gate in a jog region between the first region and the second region to expose a portion of a semiconducting fin and form an isolation volume;

etching to remove the exposed portion of the semiconducting fin and create a trench in the substrate; and filling the trench and the isolation volume with at least one dielectric material to form a CPODE structure that isolates the first region from the second region.

2. The method of claim 1, wherein a portion of the semiconducting fin in the first region has a greater width than a portion of the semiconducting fin in the second region.

3. The method of claim 1, wherein a portion of the semiconducting fin in the first region is offset from a portion of the semiconducting fin in the second region.

4. The method of claim 1, wherein the semiconducting fin splits into multiple portions in the first region, each portion having a smaller width than the semiconducting fin in the second region.

5. The method of claim 1, further comprising removing a dummy oxide layer from the exposed portion of the semiconducting fin prior to etching.

6. The method of claim 1, wherein walls of the trench and the isolation volume are lined with a first dielectric material and then filled with a second dielectric material.

7. The method of claim 6, wherein the first dielectric material is an oxide and the second dielectric material is a nitride.

8. The method of claim 1, wherein the semiconducting fin comprises alternating layers of a semiconducting nanosheet and a sacrificial layer.

9. The method of claim 8, wherein the sacrificial layers removed after the CPODE structure is formed.

10. The method of claim 1, wherein the dummy gate is removed by:

forming a hard mask layer over the substrate;

patterning the hard mask layer to expose the dummy gate; and etching to remove the dummy gate.

11. The method of claim 1, further comprising:

planarizing to expose a second dummy gate in the first region and a third dummy gate in the second region;

etching to remove the second dummy gate and the third dummy gate, forming a gate volume in the first region and a gate volume in the second region; and depositing an electrically conductive material in the gate volume in the first region and the gate volume in the second region to form a first transistor and a second transistor.

12. A method for isolating two adjacent transistors, comprising:

receiving a substrate having a first semiconducting fin on a first region and a second semiconducting fin on a second region, wherein the first semiconducting fin and the second semiconducting fin contact each other at a jog region, and wherein each semiconducting fin comprises alternating layers of a semiconducting nanosheet and a sacrificial nanosheet;

removing a dummy gate within or adjacent the jog region to expose a portion of the first semiconducting fin and form an isolation volume;

etching to remove the exposed portion of the first semiconducting fin and create a trench in the substrate;

filling the trench and the isolation volume with at least one dielectric material to form a CPODE structure between the first region and the second region;

planarizing to expose a primary dummy gate in the first region and a secondary dummy gate in the second region;

removing the primary dummy gate, the secondary dummy gate, and the sacrificial nanosheet layers, forming a gate volume in the first region and a gate volume in the second region; and depositing an electrically conductive material in the gate volume in the first region and the gate volume in the second region to form two adjacent transistors electrically isolated from each other by the CPODE structure.

13. The method of claim 12, wherein the first semiconducting fin has a greater width than the second semiconducting fin.

14. The method of claim 12, wherein the first region has a plurality of semiconducting fins that contact the second semiconducting fin.

15. The method of claim 12, wherein the first semiconducting fin and the second semiconducting fin are offset from each other.

16. A method for isolating two adjacent transistors, comprising:

removing a dummy gate in a jog region between the two adjacent transistors to expose a portion of a semiconducting fin and form an isolation volume;

etching to remove the exposed portion of the semiconducting fin and create a trench in the substrate;

filling the trench and the isolation volume with at least one dielectric material to form a CPODE structure that isolates the two adjacent transistors from each other.

17. The method of claim 16, further comprising removing a dummy oxide layer from the exposed portion of the semiconducting fin prior to etching.

18. The method of claim 16, wherein walls of the trench and the isolation volume are lined with a first dielectric material and then filled with a second dielectric material.

19. The method of claim 18, wherein the first dielectric material is an oxide and the second dielectric material is a nitride.

20. The method of claim 16, further comprising forming a gate electrode in each of the two adjacent transistors after forming the CPODE structure.

* * * * *